(12) United States Patent
Seong et al.

(10) Patent No.: US 12,557,478 B2
(45) Date of Patent: Feb. 17, 2026

(54) LIGHT EMITTING DISPLAY APPARATUS

(71) Applicant: LG Display Co., Ltd., Seoul (KR)

(72) Inventors: Sejong Seong, Paju-si (KR); Seungkyeom Kim, Paju-si (KR); Soyoung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 642 days.

(21) Appl. No.: 17/977,819

(22) Filed: Oct. 31, 2022

(65) Prior Publication Data

US 2023/0217721 A1 Jul. 6, 2023

(30) Foreign Application Priority Data

Dec. 31, 2021 (KR) .................. 10-2021-0194756

(51) Int. Cl.
*H01L 27/32* (2006.01)
*H10D 86/40* (2025.01)
*H10D 86/60* (2025.01)
*H10K 59/121* (2023.01)
*H10K 59/122* (2023.01)
*H10K 59/131* (2023.01)

(52) U.S. Cl.
CPC ......... *H10K 59/122* (2023.02); *H10D 86/441* (2025.01); *H10D 86/60* (2025.01); *H10K 59/1213* (2023.02); *H10K 59/131* (2023.02)

(58) Field of Classification Search
None
See application file for complete search history.

(56) References Cited

U.S. PATENT DOCUMENTS

| 11,430,840 | B2 | 8/2022 | Kang | |
|---|---|---|---|---|
| 2019/0103450 | A1* | 4/2019 | Heo | H10K 50/82 |
| 2019/0115403 | A1 | 4/2019 | Kang | |
| 2022/0085077 | A1* | 3/2022 | Lee | H10D 86/443 |
| 2022/0131104 | A1* | 4/2022 | Kim | H10K 50/822 |
| 2022/0352263 | A1* | 11/2022 | Lee | H10K 59/122 |

FOREIGN PATENT DOCUMENTS

| CN | 113540194 A | 10/2021 |
|---|---|---|
| KR | 10-2017-0015829 A | 2/2017 |
| KR | 10-2019-0042395 A | 4/2019 |
| KR | 10-2021-0084877 A | 7/2021 |

OTHER PUBLICATIONS

Korean Intellectual Property Office, Office Action, Korean Patent Application No. 10-2021-0194756, Sep. 16, 2025, 14 pages.

* cited by examiner

*Primary Examiner* — William C Trapanese
(74) *Attorney, Agent, or Firm* — Fenwick & West LLP

(57) ABSTRACT

A light emitting display apparatus includes a planarization layer provided in a substrate, a plurality of anodes provided on the planarization layer, a bank including opening regions exposing the anodes, a light emitting layer provided on the plurality of anodes and the bank, and a cathode provided on the light emitting layer, the cathode including a boundary region cathode and a main cathode, wherein a boundary groove is at an outer portion of each of the plurality of anodes.

24 Claims, 17 Drawing Sheets

LIGHT EMITTING DISPLAY APPARATUS

CROSS-REFERENCE TO RELATED APPLICATION

This application claims the benefit of the Republic of Korea Patent Application No. 10-2021-0194756 filed on Dec. 31, 2021, which is hereby incorporated by reference in its entirety.

BACKGROUND

Field of Technology

The present disclosure relates to a light emitting display apparatus.

Discussion of the Related Art

Light emitting display apparatuses are display apparatuses, which emit light by using a light emitting device, and include a light emitting display panel which includes a plurality of light emitting devices.

As a resolution of the light emitting display panel increases progressively, the undesired emission of light occurs due to a lateral leakage current (LLC) between adjacent pixels.

The emission of light caused by the LLC between adjacent pixels occurs due to a light emitting layer and a cathode, which are continuously provided in adjacent pixels.

SUMMARY

Accordingly, the present disclosure is directed to providing a light emitting display apparatus that substantially obviates one or more problems due to limitations and disadvantages of the related art.

In one embodiment, a light emitting display apparatus comprises: a planarization layer on a substrate; a plurality of anodes on the planarization layer; a bank including a plurality of opening regions exposing the plurality of anodes; a light emitting layer on the plurality of anodes and the bank; and a cathode on the light emitting layer, the cathode including a boundary region cathode and a main cathode, wherein a boundary groove is located at an outer portion of each of the plurality of anodes, the boundary groove including a first boundary groove located between pixels arranged in a first direction of the substrate, and a second boundary groove located between pixels arranged in a second direction that is different from the first direction, wherein the bank comprises: a first bank including a first material that covers the first boundary groove; and a second bank including a second material that is different from the first material of the first bank, the second bank covering the second boundary groove, wherein the first boundary groove includes an undercut, the boundary region cathode isolated from the main cathode in the first boundary groove by the undercut.

In one embodiment, a light emitting display apparatus comprises: a substrate; a planarization layer on the substrate; a plurality of pixels on the planarization layer including a first pixel, a second pixel, and a third pixel, the first pixel and the second pixel adjacent to each other in a first direction, and the first pixel and the third pixel adjacent to each other in a second direction that is different from the first direction; a first boundary groove in the planarization layer, the first boundary groove between the first pixel and the second pixel; a second boundary groove in the planarization layer, the second boundary groove between the first pixel and the third pixel; and a plurality of banks that define light emission regions of the plurality of pixels, the plurality of banks including a first bank that is in the first boundary groove and a second bank that is in the second boundary groove, wherein a thickness of the first bank in the first boundary groove is less than a thickness of the second bank in the second boundary groove.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIGS. 8A, 8B, and 8C to 15A, 15B, and 15C are exemplary diagrams for describing a method of manufacturing a light emitting display apparatus according to the present disclosure.

DETAILED DESCRIPTION

Figure 1:
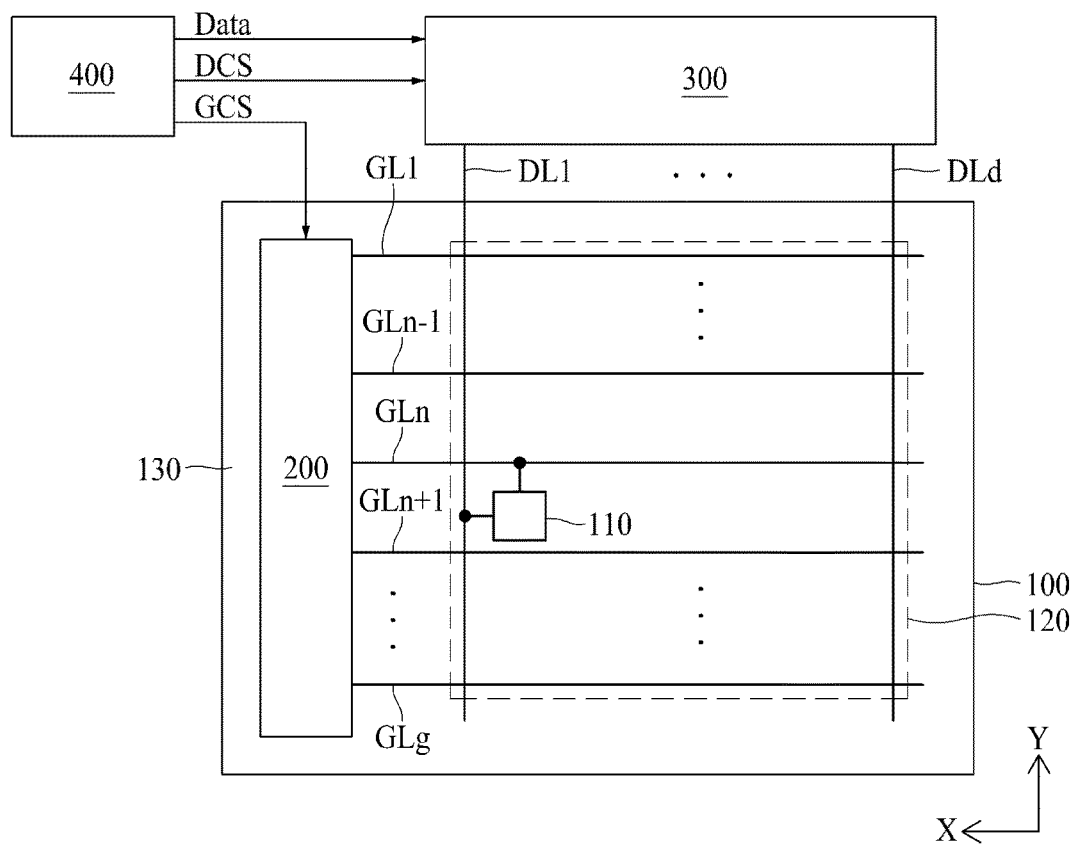
FIG. 1 is an exemplary diagram illustrating a configuration of a light emitting display apparatus according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
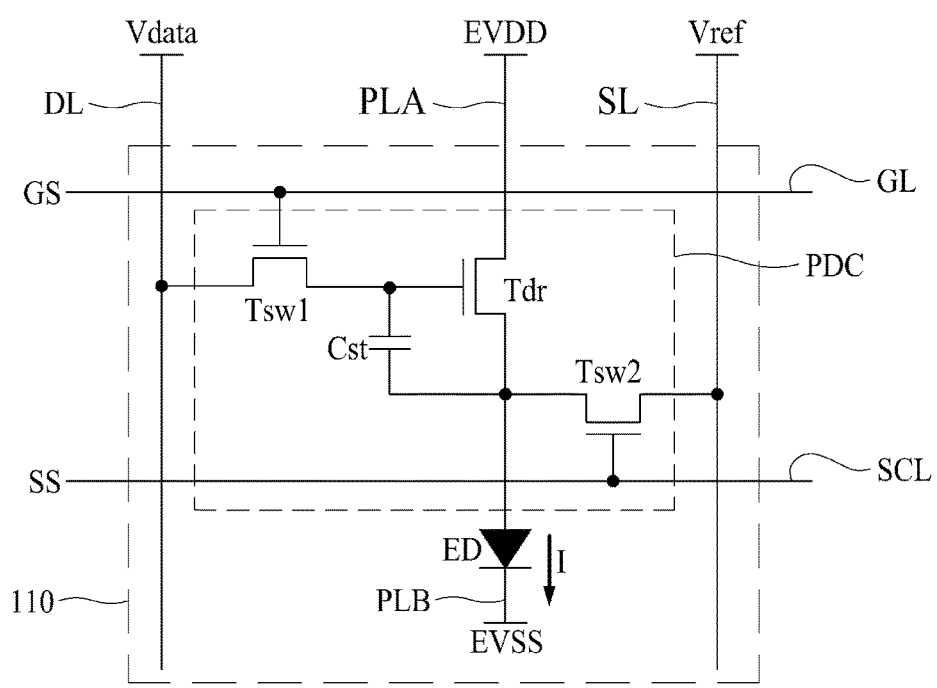
FIG. 2 is an exemplary diagram illustrating a structure of a pixel applied to a light emitting display apparatus according to one embodiment of the present disclosure.

FIG. 1 is an exemplary diagram illustrating a configuration of a light emitting display apparatus according to one embodiment the present disclosure. FIG. 2 is an exemplary diagram illustrating a structure of a pixel applied to a light emitting display apparatus according to one embodiment the present disclosure.

The light emitting display apparatus according to the present disclosure may configure various electronic devices. The electronic devices may include, for example, smartphones, tablet personal computers (PCs), televisions (TVs), and monitors.

The light emitting display apparatus to which the present disclosure is applied, as illustrated in FIG. 1, may include a light emitting display panel 100 which includes a display area 120 displaying an image and a non-display area 130 provided outside the display area 120, a gate driver 200 which supplies a gate signal to a plurality of gate lines GL1 to GLg provided in the light emitting display panel 100, a data driver 300 which supplies data voltages to a plurality of data lines DL1 to DLd provided in the light emitting display panel 100, and a controller 400 which controls driving of the gate driver 200 and the data driver 300. Here, g and d may each be a natural number.

First, the light emitting display panel 100 may include the display area 120 and the non-display area 130. The gate lines GL1 to GLg, the data lines DL1 to DLd, and the pixels 110 may be provided in the display area 120.

The pixel 110 included in the light emitting display panel 100, as illustrated in FIG. 2, may include a pixel driving circuit PDC and an emission area. The pixel driving circuit PDC may include a switching transistor Tsw1, a storage capacitor Cst, a driving transistor Tdr, and a sensing transistor Tsw2, and the emission area may include a light emitting device ED.

Brightness of light may be controlled based on a level of a current I flowing in the light emitting device ED, a level of the current I flowing in the light emitting device ED may be controlled by the driving transistor Tdr, and the driving transistor Tdr may be controlled by a data voltage Vdata.

The light emitting device ED may include one of an organic light emitting layer, an inorganic light emitting layer, and a quantum dot light emitting layer, or may include a stack or combination structure of an organic light emitting layer (or an inorganic light emitting layer) and a quantum dot light emitting layer.

The light emitting device ED may emit light corresponding to one of various colors such as red, green, and blue, or may emit white light.

The switching transistor Tsw1 configuring the pixel driving circuit PDC may be turned on or off by a gate signal GS supplied through a gate line GL, and when the switching transistor Tsw1 is turned on, a data voltage Vdata supplied through a data line DL may be supplied to the driving transistor Tdr. A first voltage EVDD may be supplied to the driving transistor Tdr and the light emitting device ED through a first voltage supply line PLA, and a second voltage EVSS may be supplied to the light emitting device ED through a second voltage supply line PLB. The sensing transistor Tsw2 may be turned on or off by a sensing control signal SS supplied through a sensing control line SCL, and a sensing line SL may be connected to the sensing transistor Tsw2. A reference voltage Vref may be supplied to the pixel 110 through the sensing line SL, and a sensing signal associated with a characteristic variation of the driving transistor Tdr may be transferred to a sensing unit through the sensing transistor Tsw2 and the sensing line SL. The sensing unit may be included in the data driver 300 and may be provided independently of the data driver 300.

The pixel 110 applied to the present disclosure may be formed in a structure illustrated in FIG. 2, but is not limited thereto. Accordingly, the pixel 110 applied to the present disclosure may be changed to various types as well as the structure illustrated in FIG. 2.

In the light emitting display panel 100, pixel areas including the pixels 110 may be formed, and signal lines for supplying various signals to the pixel driving circuit PDC included in the pixel 110 may be formed.

For example, in the light emitting display panel including the pixel 110 illustrated in FIG. 2, the signal lines may include the gate line GL, the data line DL, the sensing control line SCL, the first voltage supply line PLA, the second voltage supply line PLB, and the sensing line SL.

The data driver 300 may supply data voltages Vdata to the data lines DL1 to DLd.

The data driver 300 may be mounted on a chip on film (COF) attached on the light emitting display panel 100. Also, the data driver 300 may be directly equipped in the light emitting display panel 100 and may be connected to the controller 400 mounted on a main substrate.

The data driver 300 may be implemented as one integrated circuit (IC) along with the controller 400. In this case, the IC may be equipped in a COF, or may be directly equipped in the light emitting display panel 100.

The data driver 300 may receive a sensing signal, associated with a characteristic variation of the driving transistor Tdr included in the light emitting display panel 100, from the light emitting display panel 100 and may transfer the sensing signal to the controller 400.

The gate driver 200 may be configured as an IC and mounted in the non-display area 130. Also, the gate driver 200 may be directly embedded in the non-display area 130 by using a gate in panel (GIP) type. In a case which uses the GIP type, transistors configuring the gate driver 200 may be provided in the non-display area 130 through the same process as transistors included in each of the pixels 110 of the display area 120.

When a gate pulse generated by the gate driver 200 is supplied to a gate of the switching transistor Tsw1 included in the pixel 110, the switching transistor may be turned on. When a gate off signal is supplied to the switching transistor Tsw1, the switching transistor may be turned off. A gate signal GS supplied to the gate line GL may include the gate pulse and the gate off signal.

Finally, the controller 400 may include a data aligner which realigns input video data transferred from an external system to generate image data Data by using a timing synchronization signal transferred from the external system and supplies the image data Data to the data driver 300, a control signal generator which generates a gate control signal GCS and a data control signal DCS by using the timing synchronization signal, an input unit which receives the timing synchronization signal and the input video data transferred from the external system and respectively transfers the timing synchronization signal and the input video data to the data aligner and the control signal generator, and an output unit which supplies the data driver 300 with the image data Data generated by the data aligner and the data control signal DCS generated by the control signal generator and supplies the gate driver 200 with the gate control signals GCS generated by the control signal generator.

The controller 400 may analyze touch sensing signals received through a touch panel embedded in or attached on the light emitting display panel 100 to detect the occurrence of touch and a touch position or lack of touch.

The external system may perform a function of driving the controller 400 and an electronic device. For example, when the electronic device is a smartphone, the external system may receive various sound information, video information, and letter information over a communication network and may transfer the received video information to the controller 400. In this case, the image information may include input video data.

Hereinafter, a light emitting display panel having a pixel structure illustrated in FIG. 2 among various types of light emitting display panels will be described as an example of a light emitting display panel applied to the present disclosure.

Figure 3:
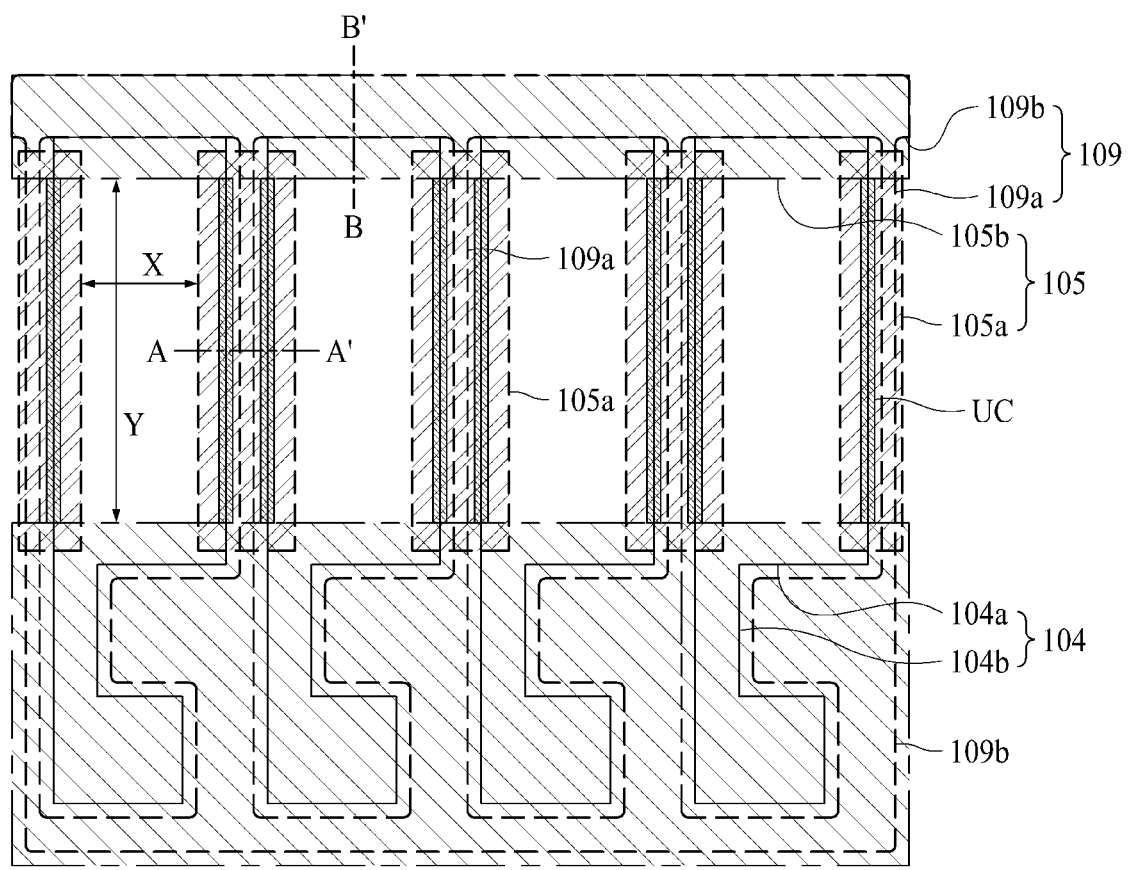
FIG. 3 is a plan view illustrating a plurality of pixels included in a light emitting display panel according to one embodiment of the present disclosure.
Figure 4:
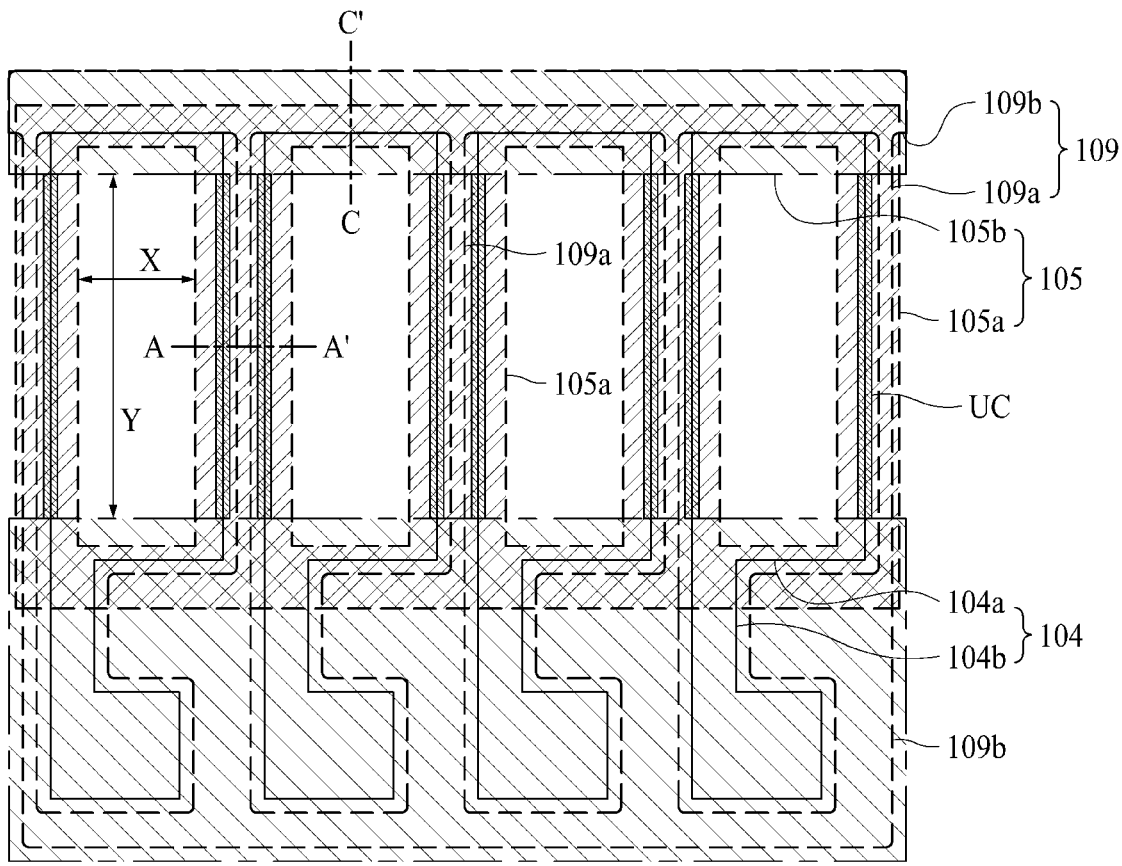
FIG. 4 is another plan view illustrating a plurality of pixels included in a light emitting display panel according to one embodiment of the present disclosure.
Figure 5:
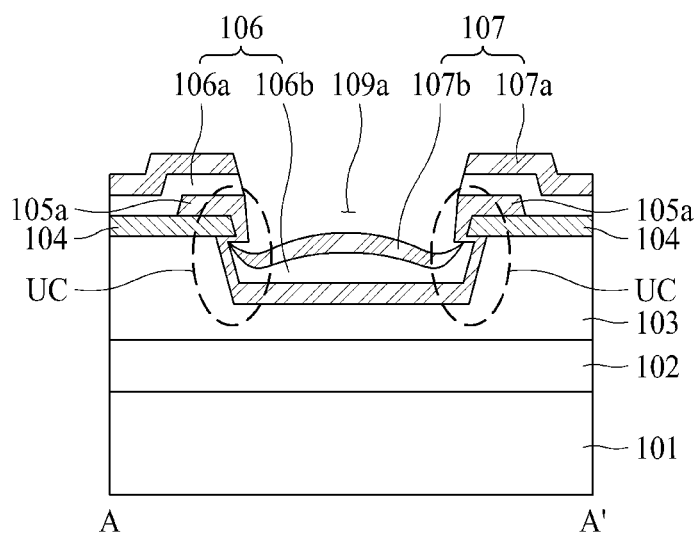
FIG. 5 is an exemplary diagram illustrating a cross-sectional surface taken along line A-A' illustrated in FIGS. 3 and 4 according to one embodiment of the present disclosure.
Figure 6:
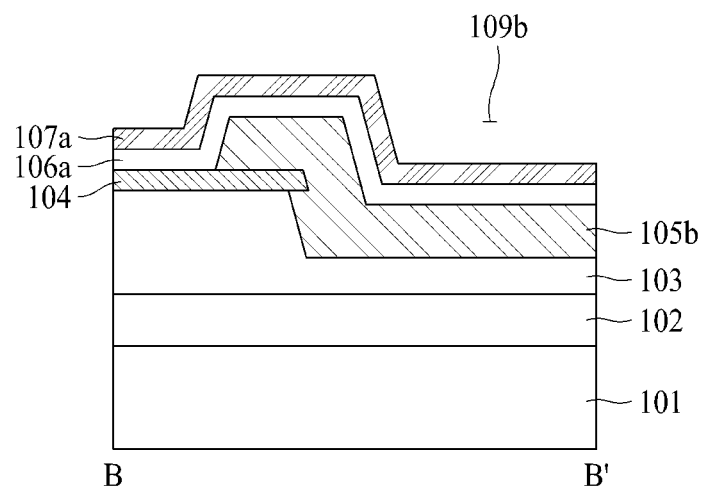
FIG. 6 is an exemplary diagram illustrating a cross-sectional surface taken along line B-B' illustrated in FIG. 3 according to one embodiment of the present disclosure.
Figure 7:
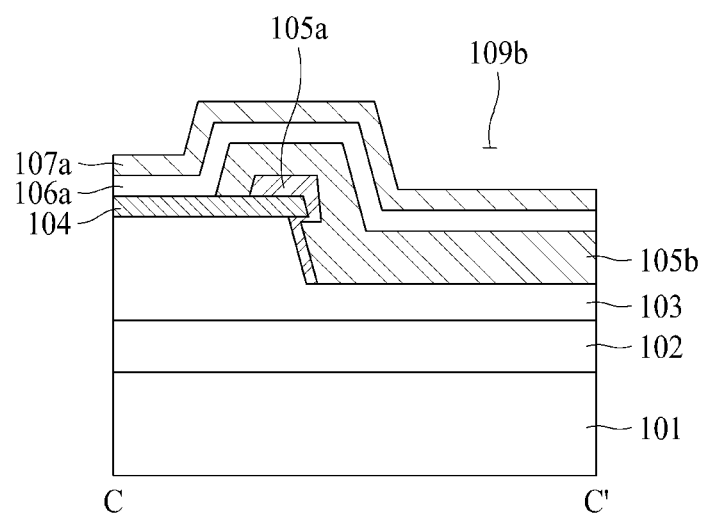
FIG. 7 is an exemplary diagram illustrating a cross-sectional surface taken along line C-C' illustrated in FIG. 4 according to one embodiment of the present disclosure.

FIG. 3 is a plan view illustrating a plurality of pixels (e.g., four pixels) included in a light emitting display panel according to one embodiment the present disclosure. FIG. 4 is another plan view illustrating a plurality of pixels included in a light emitting display panel according to one embodiment the present disclosure. FIG. 5 is an exemplary diagram illustrating a cross-sectional surface taken along line A-A' illustrated in FIGS. 3 and 4 according to one embodiment the present disclosure. FIG. 6 is an exemplary diagram illustrating a cross-sectional surface taken along line B-B' illustrated in FIG. 3 according to one embodiment the present disclosure. FIG. 7 is an exemplary diagram illustrating a cross-sectional surface taken along line C-C' illustrated in FIG. 4 according to one embodiment the present disclosure. Particularly, in FIGS. 3 to 6, four pixels arranged along an $n^{th}$ gate line GLn illustrated in FIG. 1 is illustrated.

A light emitting display panel according to the present disclosure, as illustrated in FIGS. 3 to 7, may include a planarization layer 103 which is provided on a substrate 101, a plurality of anodes 104 which are provided on the planarization layer 103, a bank 105 including a plurality of opening regions where the anodes 104 are exposed, a light emitting layer 106 which is provided on the anodes 104 and the bank 105, and a cathode 107 which is provided on the light emitting layer 106 and includes a boundary region cathode 107b and a main cathode 107a.

Here, a plurality of boundary grooves 109a and 109b may be provided outside each of the anodes 104. In one embodiment, the boundary grooves 109a and 109b are depressions formed in the planarization layer 103. In FIGS. 3 and 4, a region except the anodes 104 may be a region where the boundary grooves are formed. That is, the anodes 104 may be spaced apart from each other with the boundary grooves therebetween.

The bank 105 may include a first bank 105a, which includes a first material and covers a first boundary groove 109a between pixels arranged in a first direction of the substrate 101 among the boundary grooves, and a second bank 105b which includes a second material differing from the first material and covers a second boundary groove 109b between pixels arranged in a second direction of the substrate 101 among the boundary grooves.

The first direction and the second direction may be variously set. For convenience of description, in the following description, the first direction may be defined as a horizontal direction of the light emitting display panel 100 illustrated in FIG. 1, and the second direction may be defined as a vertical direction of the light emitting display panel 100 illustrated in FIG. 1. In this case, the gate line GL may be arranged in the first direction, and the data line DL may be arranged in the second direction.

The first boundary groove 109a, as illustrated in FIGS. 3 and 4, may be provided between pixels arranged in the first direction of the substrate 101.

The second boundary groove 109b may be provided in all regions except a region, where the first boundary groove 109a is provided, of an outer portion of the anode 104. Accordingly, as illustrated in FIGS. 3 and 4, the second boundary groove 109b may be provided in an upper end and a lower end of the anode 104. That is, the second boundary groove 109b may be provided between pixels arranged in the second direction of the substrate 101.

The cathode 107 may include a boundary region cathode 107b, which is provided in the first boundary groove 109a provided between two pixels 110 adjacent to each other in the first direction, and a main cathode 107a which is provided in the opening regions of the pixels 110 and the second boundary grooves 109b.

The opening region may denote a region referred to by X and Y in FIGS. 3 and 4. That is, in FIGS. 3 and 4, X represents a width of the opening region in the first direction, and Y represents a width of the opening region in the second direction.

The boundary region cathode 107b may be isolated from the main cathode 107a by an undercut UC provided in the first boundary groove 109a.

The undercut UC may be provided between anodes adjacent to each other in the first direction in the first boundary groove 109a. Particularly, as illustrated in FIG. 5, the undercut UC may be formed by a portion, extending to the first boundary groove 109a, of the anode 104 and the first bank 105a provided at a lateral surface of the first boundary groove 109a.

Hereinafter, a basic structure of the light emitting display panel 100 will be described with reference to FIGS. 3 to 7.

First, the substrate 101 may be a glass substrate or a plastic substrate, and moreover, may be formed of various kinds of films.

A pixel driving circuit layer 102 including the driving transistor Tdr, as illustrated in FIG. 6, may be provided on the substrate 101.

The pixel driving circuit layer 102 may include the pixel driving circuit PDC including the driving transistor Tdr. The pixel driving circuit PDC, as described above with reference to FIG. 2, may include the switching transistor Tsw1, the storage capacitor Cst, the driving transistor Tdr, and the sensing transistor Tsw2.

Moreover, the pixel driving circuit layer 102 may include the data line DL, the gate line GL, the sensing control line SCL, the sensing line SL, and the first voltage supply line PLA, which are connected to the pixel driving circuit PDC.

Therefore, the pixel driving circuit layer 102 may include at least two metal layers and at least two insulation layers for insulating the at least two metal layers.

Moreover, the pixel driving circuit layer 102 may further include a buffer provided between the driving transistor Tdr and the substrate 101.

Each of the buffer and the insulation layers may include at least one inorganic layer or at least one organic layer, or may include at least one inorganic layer and at least one inorganic layer.

Each of the metal layers may include at least one of various metals such as copper (Cu) and molybdenum-titanium alloy (MoTi).

A planarization layer 103 may be provided on the pixel driving circuit layer 102.

For example, the pixel driving circuit layer 102 may include various kinds of transistors and signal lines, which configure the pixel driving circuit PDC. In this case, heights of the various kinds of transistors and signal lines may differ, and a height of a region including the transistors and the signal lines may differ from that of a region including no transistor and signal line.

Due to such a height difference, an upper surface formed by the transistors and the signal lines may not be flat. Accordingly, an upper surface of the pixel driving circuit layer 102 may not be flat.

The planarization layer 103 may planarize the upper surface of the pixel driving circuit layer 102 which is not flat. That is, the planarization layer 103 may be formed to have a height which is greater than the pixel driving circuit layer 102, and thus, an upper surface of the planarization layer 103 may form a flat surface.

The planarization layer 103 may include at least one inorganic layer or at least one organic layer, or may include at least one inorganic layer and at least one inorganic layer.

The anodes 104 may be provided at an upper end of the planarization layer 103. The anode 104 may configure the light emitting device ED.

The anode 104 may be electrically connected to the driving transistor Tdr included in the pixel driving circuit layer 102, and as illustrated in FIGS. 3 and 4, may be patterned for each pixel 110.

The anode 104 may be one of two electrodes configuring the light emitting device ED. For example, when the light emitting device ED is an organic light emitting diode, the organic light emitting diode may include a first pixel electrode, a light emitting layer 106 provided on the first pixel electrode, and a second pixel electrode provided on the light emitting layer 106. The first pixel electrode may be the anode 104, and the second pixel electrode may be the cathode 107. In this case, the anode 104 may be connected to the driving transistor Tdr.

That is, the anode 104 provided on the planarization layer 103 may be electrically connected to a transistor (particularly, the driving transistor Tdr) included in the pixel driving circuit layer 102.

The anode 104 may include a transparent electrode such as indium tin oxide (ITO) or indium zinc oxide (IZO), or may include an opaque electrode such as copper (Cu) or may include transparent electrode and an opaque electrode.

When the light emitting display panel according to the present disclosure uses a top emission type (i.e., a type where light is output in an upward direction of the anode 104), the anode 104 may include at least one opaque electrode.

When the light emitting display panel according to the present disclosure uses a bottom emission type (i.e., a type where light is output in a downward direction of the anode 104), the anode 104 may include at least one transparent electrode.

The anode 104 may include a main anode 104a corresponding to the opening region and a connection anode 104b which extends from the main anode and is connected to the driving transistor Tdr. A shape of the connection anode 104b may be implemented as various shapes, based on a connection with the driving transistor Tdr. The boundary groove 109 may be provided in an outer portion of each of the main anode 104*a* and the connection anode 104*b*.

The first boundary groove 109*a* may be provided between main anodes 104*a* configuring pixels arranged along a gate line, and the second boundary groove 109*b* may be provided in a region, except a region including the first boundary groove 109*a*, of the outer portion of each of the main anode 104*a* and the connection anode 104*b*.

Hereinafter, for convenience of description, the present disclosure will be described by using the anode 104 without differentiating the main anode 104*a* from the connection anode 104*b*. However, an anode described below may denote the main anode 104*a*. That is, because the first boundary groove 109*a* is provided between the main anodes 104*a* configuring the pixels arranged along the gate line and the second boundary groove 109*b* is provided in a region, except a region including the first boundary groove 109*a*, of the outer portion of the main anode 104*a*, the anode 104 described below may substantially denote the main anode 104*a*.

The bank 105 may cover outer portions of the anode 104, and thus, an opening region through which light is output may be formed in one pixel 110. That is, in FIGS. 3 and 4, an opening region having a width referred to by X and Y may not be covered by the bank 105.

The bank 105, as illustrated in FIGS. 3 and 4, may be formed by surround the outer portions of the anode 104.

That is, the bank 105 may cover the outer portions of the anode 104 and may be provided on a whole surface of the substrate 101 to expose the anode 104. However, the bank 105 may be formed to have various patterns forming an opening region.

The bank 105 may prevent or at least reduce a phenomenon where light overlap between adjacent pixels.

The bank 105 may include at least one inorganic layer or at least one organic layer, or may include at least one inorganic layer and at least one inorganic layer.

Particularly, in the present disclosure, a material of the bank 105 covering the first boundary groove 109*a* may differ from a material of the bank 105 covering the second boundary groove 109*b*.

In the following description, therefore, the bank 105 may include a first bank 105*a* covering the first boundary groove 109*a* between pixels arranged in the first direction of the substrate 101 among the boundary grooves and a second bank 105*b* covering the second boundary groove 109*b* between pixels arranged in the second direction, differing from the first direction, of the substrate 101 among the boundary grooves. A material of the first bank 105*a* may differ from a material of the second bank 105*b*.

In one embodiment the first bank 105*a* may be provided in the first boundary groove 109*a* and the second bank 105B is not provided in the first boundary groove 109*a*. Conversely, the second bank 105*b* may be provided in the second boundary groove 109*b* and the first bank 105*a* may not be provided in the second boundary groove 109*b*, or all of the first bank 105*a* and the second bank 105*b* may be provided in the second boundary groove 109*b*.

The light emitting layer 106 may be provided on the whole surface of the substrate 101 to cover the anodes 104 and the bank 105.

The light emitting layer 106 may include one of an organic light emitting layer, an inorganic light emitting layer, and a quantum dot light emitting layer, or may include a stack or combination structure of an organic light emitting layer (or an inorganic light emitting layer) and a quantum dot light emitting layer.

The light emitting layer 106 may include a hole injection layer (HIL), a hole transport layer (HTL), a hole blocking layer (HBL), an electron injection layer (EIL), an electron transport layer (ETL), an electron blocking layer (EBL), and a charge generating layer (CGL).

In a case where the light emitting layer 106 emits white light, the light emitting layer 106 may include hole injection layer (HIL)/hole transport layer (HTL), a blue organic layer, electron injection layer (EIL)/charge generating layer (CGL)/electron transport layer (ETL), a red organic layer, a yellow-green organic layer, electron injection layer (EIL)/charge generating layer (CGL)/electron transport layer (ETL), a blue organic layer, electron injection layer (EIL)/electron transport layer (ETL), and an organic buffer, which are sequentially stacked on the anode electrode 104.

The light emitting layer 106 may include layers having various stack orders, in addition to layers having a stack order described above.

The light emitting layer 106 may be configured to emit lights having various colors such as red, green, and blue, and moreover, may be configured to emit white light.

In a case where the light emitting layer 106 emits white light, a color filter may be provided under or on the light emitting layer 106.

For example, the color filter may be provided between the planarization layer 103 and the pixel driving circuit layer 102, or may be provided in the planarization layer 103 or on the cathode 107. In addition, the color filters may be formed at positions. Particularly, the color filter may be provided at a position corresponding to an opening portion of each pixel.

The light emitting layer 106 may include a boundary region light emitting layer 106*b* provided in the first boundary groove 109*a* and a main light emitting layer 106*a* provided in the second boundary groove 109*b*.

The boundary region light emitting layer 106*b* and the main light emitting layer 106*a* may be isolated from each other in the undercut UC provided in the first boundary groove 109*a*. The boundary region light emitting layer 106*b* may be connected to the main light emitting layer 106*a* in a region, except a region including the undercut UC, of the first boundary groove 109*a*.

The cathode 107 may be provided on the light emitting layer 106, and particularly, may be provided in a plate shape on the whole surface of the substrate 101.

The cathode electrode 107 may be a second pixel electrode of an organic light emitting diode.

In a case where the light emitting display panel 100 according to the present disclosure uses a top emission type, the cathode electrode 107 may be formed of a transparent electrode, and for example, may include ITO or IZO.

When the light emitting display panel according to the present disclosure uses a bottom emission type, the cathode 107 may include at least one of various metals such as copper (Cu) and molybdenum-titanium alloy (MoTi), so as to reflect light, emitted from the light emitting layer 106, in a direction toward the anode 104.

In the present disclosure, the cathode 107 may include a boundary region cathode 107*b*, provided in the first boundary groove 109*a* provided between two pixels 110 adjacent to each other in the first direction, and a main cathode 107*a* provided in the opening regions and the second boundary groove 109*b*.

That is, the boundary region cathode 107*b* may be provided in the first boundary groove 109*a*, and the main cathode 107*a* may be provided in all regions, except the first boundary groove 109*a*, of the display area 120 of the substrate 101.

In this case, the boundary region cathode 107b and the main cathode 107a may be isolated from each other in the undercut UC provided in the first boundary groove 109a. The boundary region cathode 107b may be connected to the main cathode 107a in a region, except a region including the undercut UC, of the first boundary groove 109a.

The boundary region cathode 107b and the main cathode 107a may be formed through the same process, and thus, may include the same material.

Finally, the cathode 107 may be covered by the passivation layer.

In a case where the light emitting layer 106 emits white light, the cathode 107 may be covered by the passivation layer, the color filter may be provided at a portion, corresponding to the anode 104, of an upper end of the passivation layer, and a black matrix may be provided at a portion, corresponding to the bank 105, of an upper end of the passivation layer. Another passivation layer may be further provided on the black matrix and the color filter. Each pixel may emit, for example, one of red light, green light, white light, and blue light by using the color filter. However, as described above, the color filter may be provided at various positions of the light emitting display panel 100.

In a case where the light emitting layer 106 emits light having a unique color, the color filter may be omitted.

The passivation layer may perform a function of an encapsulation layer. The passivation layer may include at least one inorganic layer or at least one organic layer, or may include at least one inorganic layer and at least one inorganic layer.

Hereinafter, a detailed structure of the light emitting display panel 100 in the first boundary groove 109a will be described in detail with reference to FIGS. 3 to 5. FIG. 5 illustrates a cross-sectional surface of the light emitting display panel 100 in the first boundary groove 109a, and particularly, illustrates a cross-sectional surface taken along line A-A' illustrated in FIGS. 3 and 4. That is, a structure of the first boundary groove 109a of the light emitting display panel having a structure illustrated in FIG. 3 may be the same as a structure of the first boundary groove 109a of the light emitting display panel having a structure illustrated in FIG. 4. To provide an additional description, the light emitting display panels 100 illustrated in FIGS. 3 and 4 may have the same structure in the first boundary groove 109a.

First, the cathode 107 may include the boundary region cathode 107b and the main cathode 107a, the boundary groove 109 may be provided in the outer portion of the anode 104, the boundary groove 109 may include the first boundary groove 109a and the second boundary groove 109b, and the boundary region cathode 107b may be provided in the first boundary groove 109a. Also, the main cathode 107a may be provided at a portion, except the first boundary groove 109a, of the display area 120, the boundary region cathode 107b and the main cathode 107a may be isolated from each other by the undercut UC provided in the first boundary groove 109a, and the undercut UC may be provided between the planarization layer 103 and an end of the anode 104 protruding in a direction toward the first boundary groove 109a.

To provide an additional description, the boundary region cathode 107b may be provided in the first boundary groove 109a, and the main cathode 107a may be provided in the opening regions and the second boundary groove 109b.

The boundary region cathode 107b may be provided between pixels (e.g., a first pixel and a second pixel) arranged in a direction parallel to the $n^{th}$ gate line included in the substrate, and particularly, may be provided in the first boundary grooves 109a between the pixels arranged in the direction parallel to the $n^{th}$ gate line.

The boundary region light emitting layer 106b and the main light emitting layer 106a may be isolated from each other by the undercut UC provided in the first boundary groove 109a.

That is, the main light emitting layer 106a may be provided in the opening regions and the second boundary groove 109b.

The first boundary groove 109a may be provided between the pixels arranged in the direction parallel to the $n^{th}$ gate line, and a height of the planarization layer in the first boundary groove 109a may be less than that of the planarization layer including the anode. The first bank 105a may be provided on the planarization layer 103 in the first boundary groove 109a, the boundary region light emitting layer 106b may be provided on the first bank 105a provided in the first boundary groove 109a, and the boundary region cathode 107b may be provided on the boundary region light emitting layer 106b provided in the first boundary groove 109b.

The light emitting layer 106 may include the boundary region light emitting layer 106b provided in the first boundary groove 109a and the main light emitting layer 106a provided at a portion, except the first boundary groove 109a, of the display area 120, and the boundary region light emitting layer 106b and the main light emitting layer 106a may be isolated from each other by the first boundary groove 109a, in particular by the undercut UC provided in the first boundary groove 109a.

To provide an additional description, the boundary region light emitting layer 106b and the main light emitting layer 106a may be isolated from each other in a region between pixels adjacent to each other in the first direction in the first boundary groove 109a and may be connected to each other in a region between pixels adjacent to each other in the second direction in the first boundary groove 109a.

An end of the anode 104, as illustrated in FIG. 5, may protrude in a direction toward the first boundary groove 109a and past a lateral surface of the planarization layer 103. The undercut UC may be formed by the first bank 105a covering an end of the anode 104 protruding in a direction toward the first boundary groove 109a and the first bank 105a provided along the lateral surface of the planarization layer 103 at a lower end of the anode 104.

That is, the undercut UC may be provided between the planarization layer 103 and an end of the anode protruding in a direction toward the first boundary groove 109a, and in more detail, the undercut UC may be formed by the end of the anode protruding in the direction toward the first boundary groove 109a and the first bank 105a covering a lateral surface of the planarization layer 103 adjacent to the end of the anode.

To provide an additional description, the end of the anode 104 (i.e., the outer portion of the anode 104) protruding in the direction toward the first boundary groove 109a may form the undercut UC along with the lateral surface of the planarization layer 103.

A height of the planarization layer 103 in the first boundary groove 109a and the second boundary groove 109b may be less than that of the planarization layer 103 in a region except the first boundary groove 109a and the second boundary groove 109b.

In this case, a height of the planarization layer in the first boundary groove 109a may be formed to have a size which is equal or almost similar to a height of the planarization layer 103 in the second boundary groove 109b.

Finally, as illustrated in FIG. 5, the first bank 105a may be provided on the planarization layer 103 in the first boundary groove 109a, the boundary region light emitting layer 106b may be provided on the first bank 105a provided in the first boundary groove 109a, and the boundary region cathode 107b may be provided on the boundary region light emitting layer 106b provided in the first boundary groove 109a.

The first bank 105a may include an inorganic material such as silicone oxide (SiO$_2$), and the second bank 105b may include various kinds of organic materials (for example, polyimide (PI)).

In this case, the second bank 105b may be a black bank including a black material. In a case where the second bank 105b is formed of a black bank, light leakage between pixels may be prevented or at least reduced, and a laser beam reaching the cathode may be absorbed in repairing the light emitting display panel, thereby enhancing repair efficiency. Also, when the second bank 105b is formed of a black bank, this may be efficient in terms of a design margin.

The black bank may be applied to all of a light emitting display panel configured as a top emission type and a light emitting display panel configured as a bottom emission type. The first bank 105a, as illustrated in FIGS. 3 to 5, may cover the end of the anode 104 and may cover all of an undercut UC region of the first boundary groove 109a and a lower surface of the first boundary groove 109a. That is, the first bank 105a may cover all of surfaces configuring the first boundary groove 109a.

Because the first bank 105a includes an inorganic material, the first bank 105a may be formed to have a thickness which is thinner than the second bank 105b including an organic material.

In this case, the boundary region light emitting layer 106b may be isolated from the main light emitting layer 106a by the undercut UC, and moreover, the boundary region cathode 107b may also be isolated from the main cathode 107a by the undercut UC.

To provide an additional description, the light emitting layer 106 may be divided into the boundary region light emitting layer 106b and the main light emitting layer 106a, based on a height difference of the first boundary groove 109a and the undercut UC of the first boundary groove 109a, and the cathode 107 may be divided into the boundary region cathode 107b and the main cathode 107a, based on the height difference of the first boundary groove 109a and the undercut UC of the first boundary groove 109a.

Accordingly, a leakage current occurring in a pixel may not be transferred between the pixel where a leakage current occurs and a pixel adjacent thereto along a gate line. Therefore, the emission of light caused by a leakage current between adjacent pixels may be reduced.

The boundary region cathode 107b and the main cathode 107a may be covered and protected by the passivation layer.

Hereinafter, a detailed structure of the light emitting display panel 100 in the second boundary groove 109b will be described in detail with reference to FIGS. 3 to 7. FIG. 6 illustrates a cross-sectional surface taken along line B-B' illustrated in FIG. 3, namely, illustrates a cross-sectional surface of the second boundary groove 109b. FIG. 7 illustrates a cross-sectional surface taken along line C-C' illustrated in FIG. 4, namely, illustrates a cross-sectional surface of the second boundary groove 109b. That is, the light emitting display panel having a structure illustrated in FIG. 3 and the light emitting display panel having a structure illustrated in FIG. 4 may have the same structure in the first boundary groove 109a, but may have different structures in the second boundary groove 109b.

First, a structure of the light emitting display panel of FIG. 3 in the second boundary groove 109b is illustrated in FIG. 6.

The second bank 105b may be provided on the planarization layer 103 in the second boundary groove 109b. The second bank 105b, as described above, may include various kinds of organic materials and may be formed to be thicker than the first bank 105a. Thus, an undercut is not formed in the second boundary groove 109b due to the thickness of the second bank 105b.

The second bank 105b may cover the end of the anode 104 (i.e., the outer portion of the anode 104) protruding in a direction toward the second boundary groove 109b and may be provided in the second boundary groove 109b.

Particularly, the first bank 105a may be thinly provided on a lateral surface and a lower surface of the first boundary groove 109a in the first boundary groove 109a, but the second bank 105b may be filled into the second boundary groove 109b in the second boundary groove 109b. Accordingly, as illustrated in FIG. 6, the second bank 105b may be formed to have a height which is similar to that of the second boundary groove 109b.

To provide an additional description, the second bank 105b may be filled into the other region (i.e., the second boundary groove 109b), except the first boundary groove 109a, of the boundary groove 109 formed in the outer portion of the anode.

The main light emitting layer 106a may be provided on the second bank 105b provided in the second boundary groove 109b.

That is, the main light emitting layer 106a may be provided in the opening region and the second boundary groove 109b. In other words, the main light emitting layer 106a of a pixel extends from the opening region (e.g., a light emission region) of the pixel to the second boundary groove 109b that is between the pixel and another pixel in the second direction.

In this case, a step such as the undercut UC provided by the first bank 105a in the first boundary groove 109a may not be formed in the second bank 105b provided at a boundary between the opening region and the second boundary groove 109b. Accordingly, the main light emitting layer 106a may not be isolated between the opening region and the second boundary groove 109b.

The main cathode 107a may be provided on the main light emitting layer 106a provided in the second boundary groove 109b. That is, the main cathode 107a of a pixel extends from the opening region (e.g., a light emission region) of the pixel to the second boundary groove 109b that is between the pixel and another pixel in the second direction.

That is, the main cathode 107a may be provided in the opening region and the second boundary groove 109b.

In this case, because a step such as the undercut UC does not occur in the main light emitting layer 106a provided at a boundary between the opening region and the second boundary groove 109b, the main cathode 107a may not be isolated between the opening region and the second boundary groove 109b.

Finally, the main cathode 107a provided in the second boundary groove 109b may be covered and protected by the passivation layer.

Second, a structure of the second boundary groove 109b of the light emitting display panel illustrated in FIG. 4 is illustrated in FIG. 7.

The first bank 105a may be provided on the planarization layer 103 in the second boundary groove 109b.

The first bank 105a provided in the second boundary groove 109b may cover a portion of the anode 104 that extends in a direction toward the second boundary groove 109b and past a lateral surface of the second boundary groove 109b. That is, the first bank 105a may cover a lateral surface of the planarization layer 103 exposed at the second boundary groove 109b.

To provide an additional description, the first bank 105a may include an inorganic material, and thus, the first bank 105a may be provided along the end of the anode 104 protruding in a direction toward the second boundary groove 109b and the lateral surface of the second boundary groove 109b. In this case, the first bank 105a may not cover a whole lower surface of the second boundary groove 109b. That is, the first bank 105a may cover the end of the anode, cover the lateral surface of the second boundary groove 109b, and cover a portion of the lower surface of the second boundary groove 109b.

The first bank 105a provided in the second boundary groove 109b may be covered by the second bank 105b.

The second bank 105b, as described above, may include various kinds of organic materials and may be formed to be thicker than the first bank 105a.

The second bank 105b may cover the end of the anode 104 (i.e., the outer portion of the anode 104) protruding in a direction toward the second boundary groove 109b and may be provided in the second boundary groove 109b.

In this case, a structure similar to the undercut UC provided in the first boundary groove 109a may be formed by the first bank 105a provided in the second boundary groove 109b. However, the second bank 105b may be thickly formed and filled into the second boundary groove 109b. Accordingly, as illustrated in FIG. 7, the second bank 105b may be formed to have a height which is similar to that of the second boundary groove 109b.

To provide an additional description, the second bank 105b may be filled into the other region (i.e., the second boundary groove 109b), except the first boundary groove 109a, of the boundary groove 109 formed in the outer portion of the anode.

The main light emitting layer 106a may be provided on the second bank 105b provided in the second boundary groove 109b.

That is, the main light emitting layer 106a may be provided in the opening region and the second boundary groove 109b.

In this case, a step such as the undercut UC provided by the first bank 105a in the first boundary groove 109a may not be formed in the second bank 105b provided at a boundary between the opening region and the second boundary groove 109b. Accordingly, the main light emitting layer 106a may not be isolated between the opening region and the second boundary groove 109b.

To provide an additional description, a structure similar to the undercut UC may be formed by the first bank 105a provided in the second boundary groove 109b, but because the first bank 105a and the second boundary groove 109b are covered by the second bank 105b having a thick thickness, a structure similar to the undercut UC may not be formed by the second bank 105b.

The main cathode 107a may be provided on the main light emitting layer 106a provided in the second boundary groove 109b.

That is, the main cathode 107a may be provided in the opening region and the second boundary groove 109b.

In this case, because a step such as the undercut UC does not occur in the main light emitting layer 106a provided at a boundary between the opening region and the second boundary groove 109b, the main cathode 107a may not be isolated between the opening region and the second boundary groove 109b.

Finally, the main cathode 107a provided in the second boundary groove 109b may be covered and protected by the passivation layer.

According to the present disclosure described above, the first boundary groove 109a which is a main path of a leakage current and leakage light may be formed in left and right regions between pixels, and the boundary region light emitting layer 106b, the main light emitting layer 106a, the boundary region cathode 107b, and the main cathode 107a may be formed by the first boundary groove 109a. Accordingly, a leakage current and leakage light may be blocked by the boundary region light emitting layer 106b and main light emitting layer 106a and the boundary region cathode 107b and main cathode 107a, which are isolated from one another through the first boundary groove 109a.

That is, as described above, because the main light emitting layer 106a is isolated from the boundary region light emitting layer 106b, a leakage current may not occur through the light emitting layer 106 between adjacent pixels. Also, although the main light emitting layer 106a is not fully isolated from the boundary region light emitting layer 106b, because the main cathode 107a is isolated from the boundary region cathode 107b in the first boundary groove 109a, a leakage current and leakage light may not occur through the light emitting layer 106 and the cathode 107 between adjacent pixels.

Moreover, the main light emitting layer 106a and the main cathode 107a may be continuously provided between adjacent pixels in a region, where the first boundary groove 109a is not provided, of the planarization layer 103. Accordingly, the main cathode 107a may cover all pixels and may be applied to all pixels in common.

That is, according to the present disclosure, because the first boundary groove 109a and the second boundary groove 109b having a uniform depth are provided near the anode, a process of manufacturing a light emitting display panel may be simplified, and a production yield rate may be enhanced.

Particularly, according to the present disclosure, ends of a first bank (an inorganic bank) surrounding the anode may be protected by a second bank (an organic bank), and thus, the shrinkage of a light emitting device may be prevented.

Hereinafter, in order to more clarify a structure of the light emitting display apparatus according to the present disclosure described above, a method of manufacturing the light emitting display apparatus according to the present disclosure will be briefly described. Also, other embodiments of a light emitting display apparatus according to the present disclosure will be described.

FIGS. 8A, 8B, and 8C to 15A, 15B, and 15C are exemplary diagrams for describing a method of manufacturing a light emitting display apparatus according to the present disclosure. In FIGS. 8A, 8B, 8C to 15A, 15B, and 15C, (A) is a plan view illustrating four pixels included in a light emitting display panel, (B) is an exemplary diagram illustrating a cross-sectional surface taken along line D-D' illustrated in (A), and (C) is an exemplary diagram illustrating a cross-sectional surface taken along line E-E' illustrated in (A). Particularly, FIGS. 8A, 8B, 8C to 15A, 15B, and 15C are exemplary diagrams for describing a method of manufacturing the light emitting display apparatus described above with reference to FIGS. 4, 5, and 7. In the following description, therefore, descriptions which are the same as or similar to the descriptions of FIGS. 1 to 7 are omitted or will be briefly given.

First, a pixel driving circuit layer 102 including a driving transistor Tdr may be provided on a substrate 101.

Subsequently, a planarization layer 103 may be provided on the pixel driving circuit layer 102.

Figure 8A:
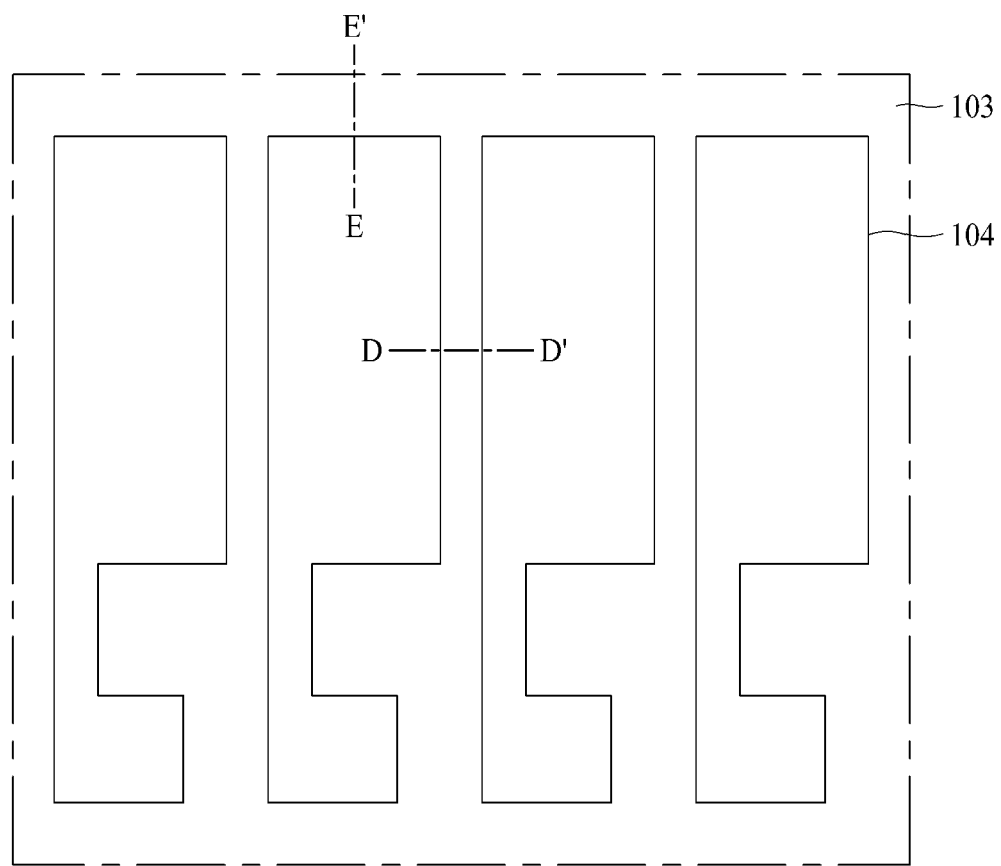
Figure 8B:
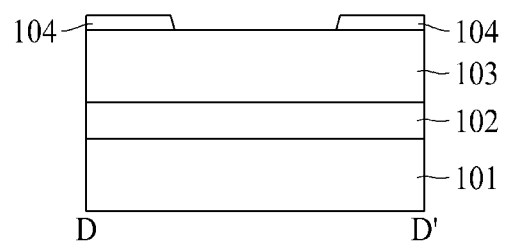
Figure 8C:
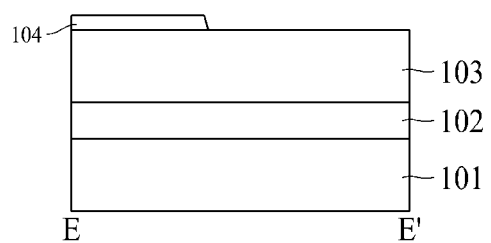

Subsequently, as illustrated in FIGS. 8A to 8C, anodes 104 may be provided on the planarization layer 103. The anode 104 may be patterned for each pixel 110.

Figure 9A:
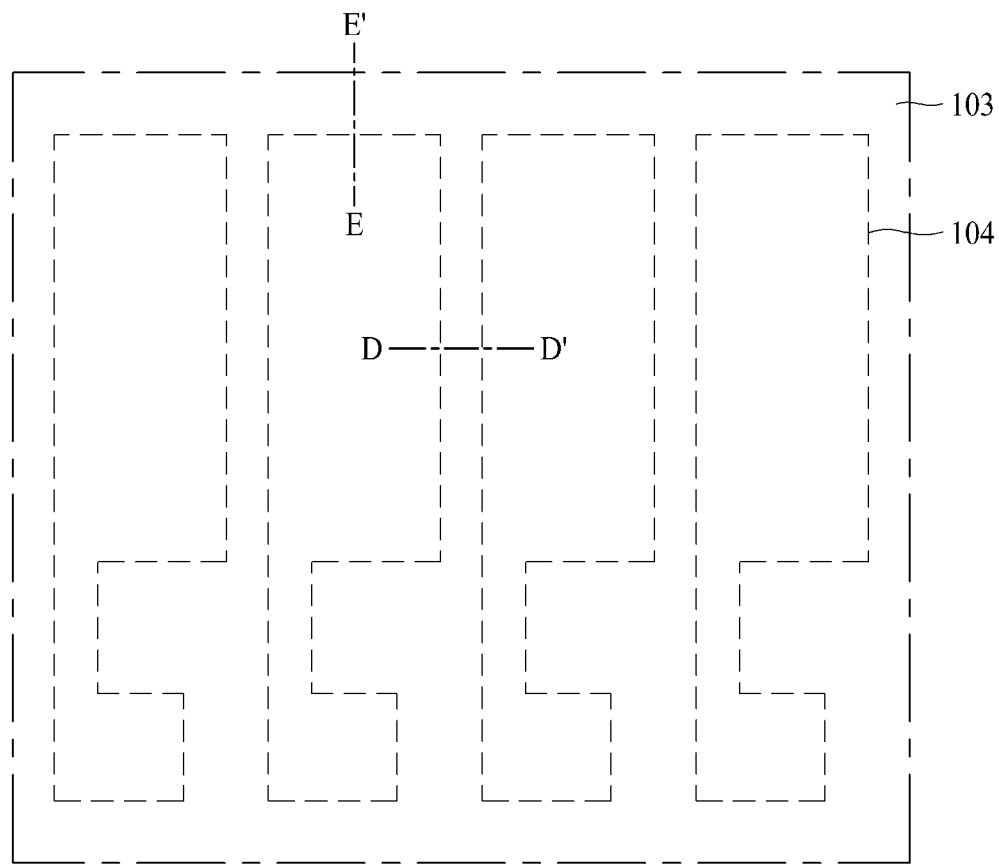
Figure 9B:
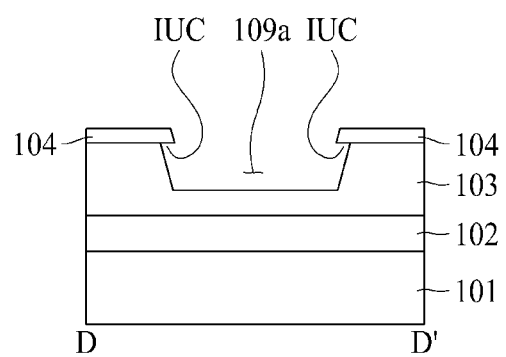
Figure 9C:
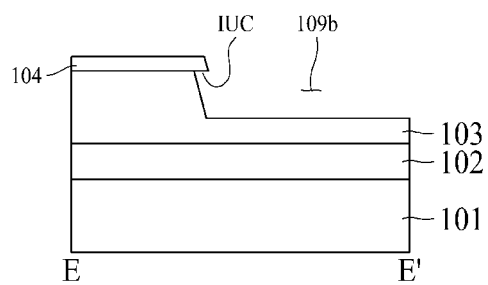

Subsequently, as illustrated in FIGS. 9A to 9C, a first boundary groove 109a and a second boundary groove 109b may be formed by dry-etching the planarization layer 103.

In this case, an outer portion of the anode 104 may protrude toward the first boundary groove 109a and the second boundary groove 109b, and thus, an initial undercut IUC may be formed at the whole outer portion of the anode 104. In FIG. 9A, the initial undercut IUC is illustrated by a dotted line. That is, the initial undercut IUC may be formed at the whole outer portion of the anode 104.

Figure 10A:
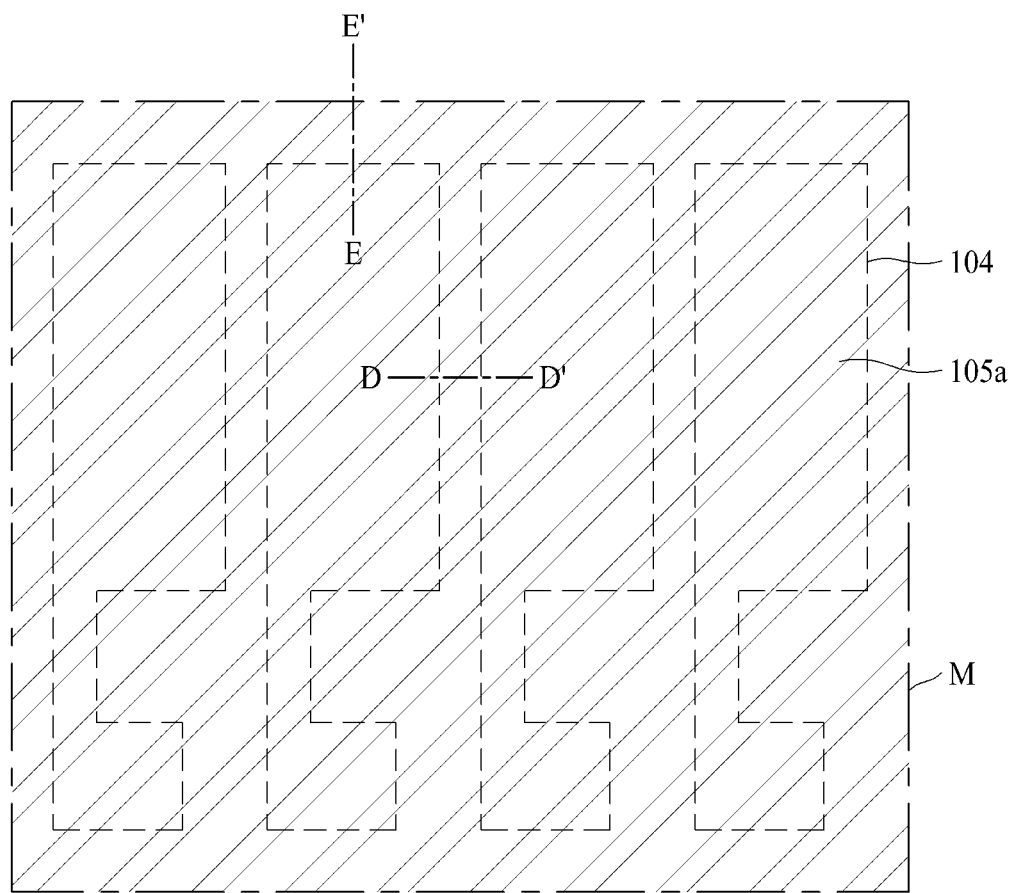
Figure 10B:
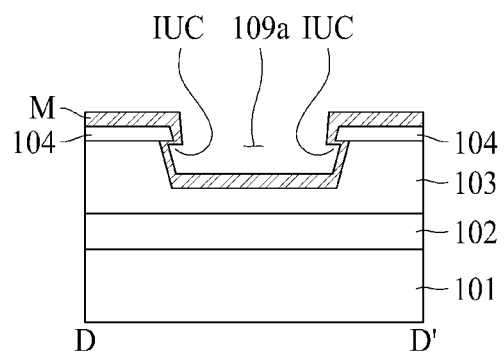
Figure 10C:
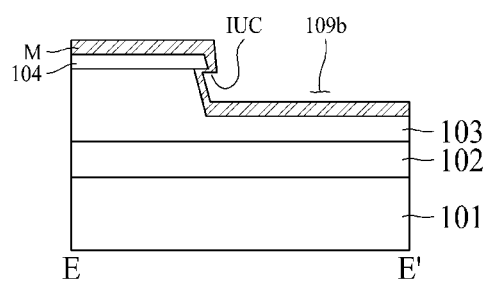

Subsequently, as illustrated in FIGS. 10A to 10C, a first material M may be provided in all of the substrate 101. The first material M may be an inorganic material such as $SiO_2$.

Figure 11A:
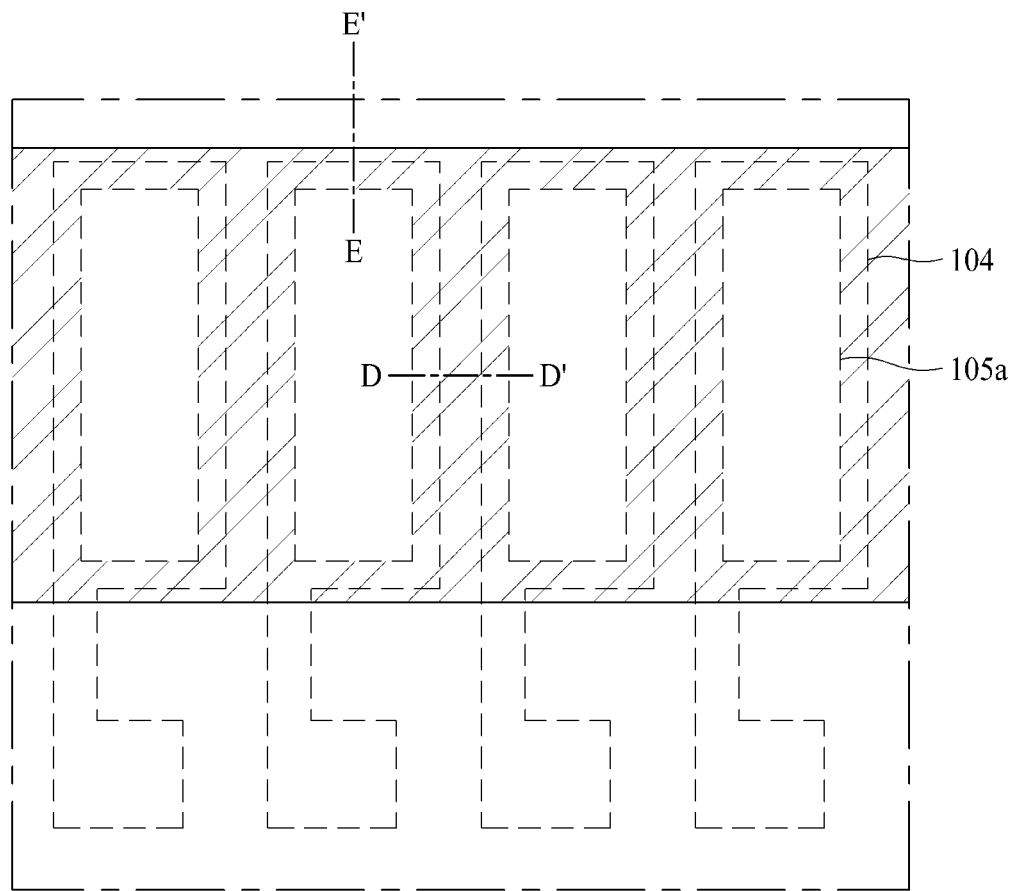
Figure 11B:
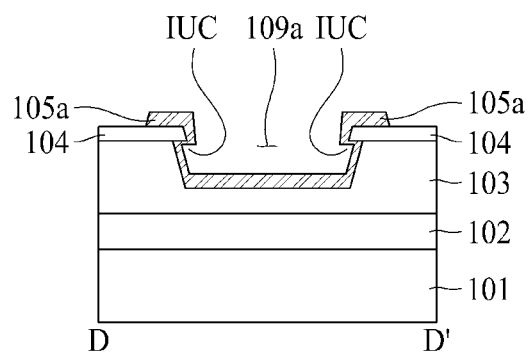
Figure 11C:
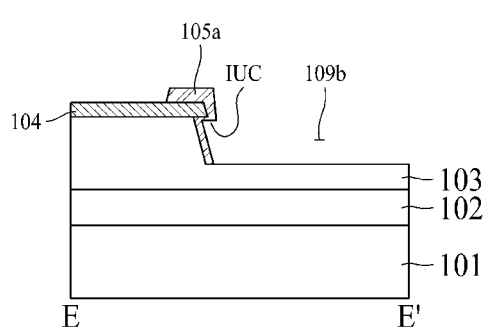

Subsequently, as illustrated in FIG. 10, the first material of an opening region may be removed by etching. In this case, as illustrated in FIG. 11B, the first material provided in the first boundary groove 109a may not be removed. Also, as illustrated in FIG. 11B, the first material provided at the initial undercut IUC portion and the outer portion of the anode 104 protruding to the second boundary groove 109b may not be removed, and the first material provided in the second boundary groove 109b may be removed.

Therefore, a first bank 105a may be formed.

Figure 12A:
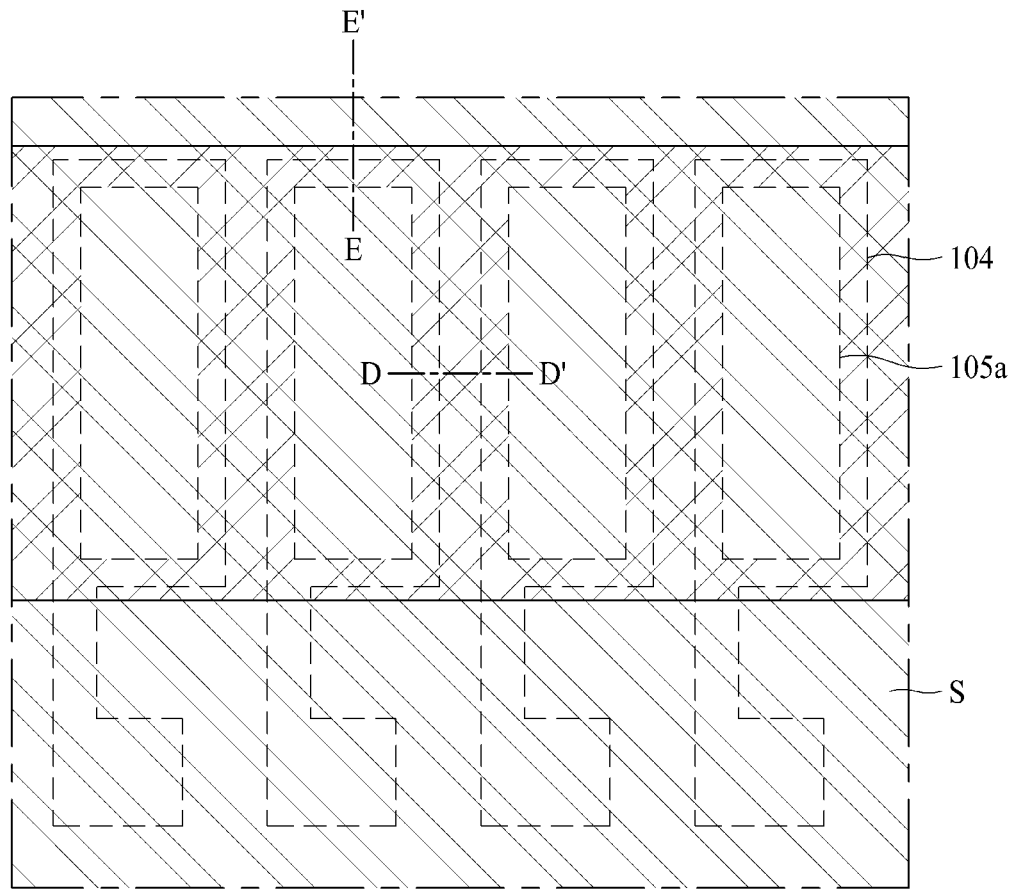
Figure 12B:
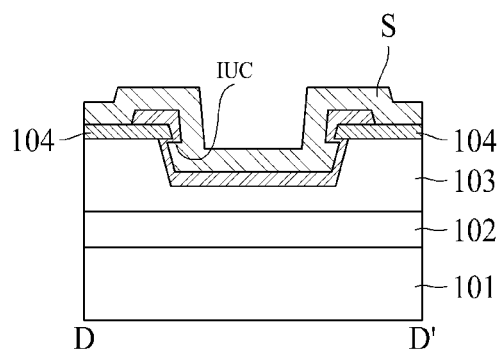
Figure 12C:
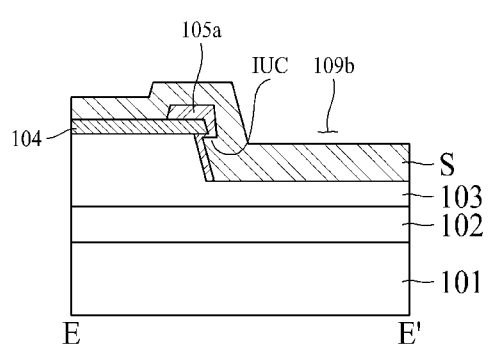

Subsequently, as illustrated in FIGS. 12A to 12C, a second material S may be provided all over the substrate 101. The second material S may be an organic material (for example, PI).

Figure 13A:
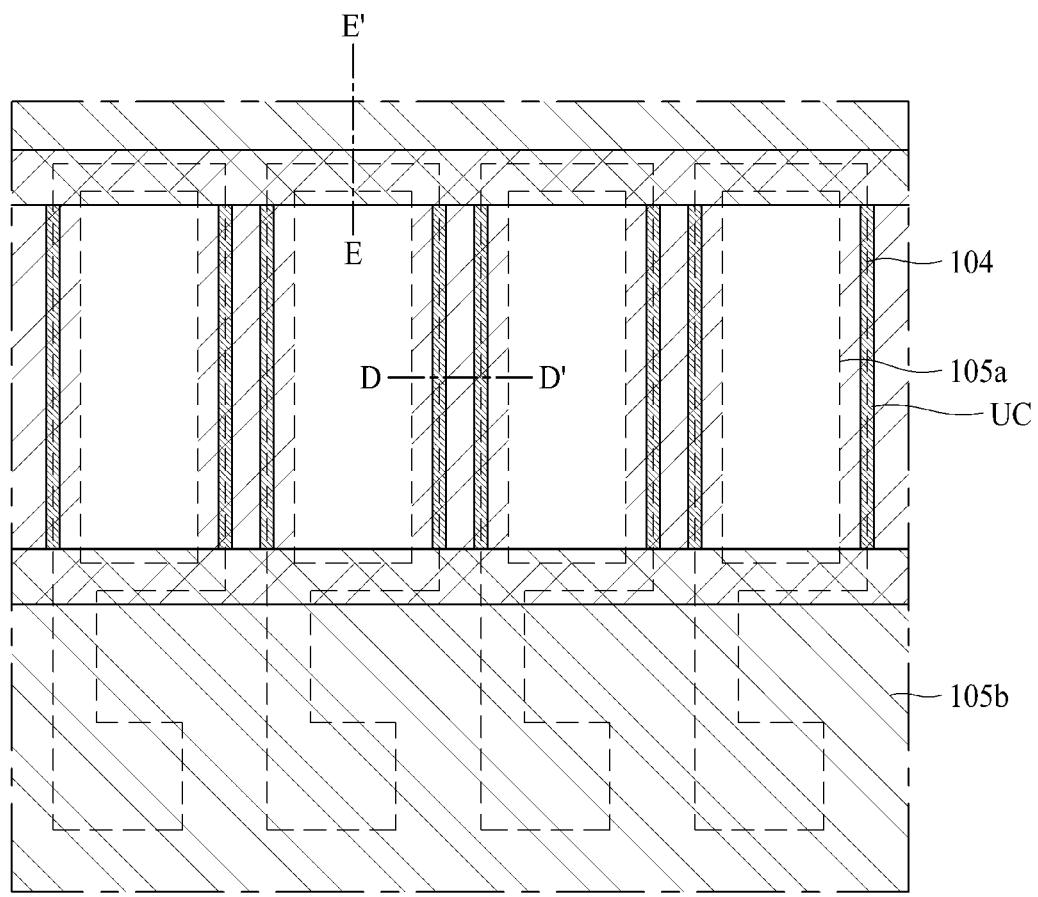
Figure 13B:
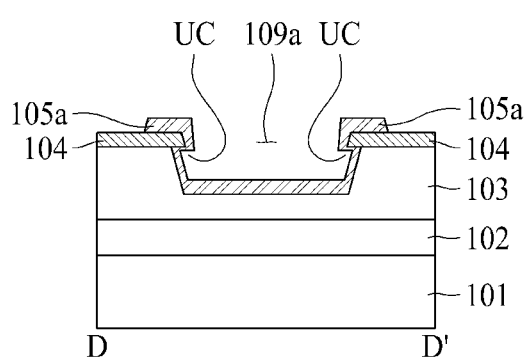
Figure 13C:
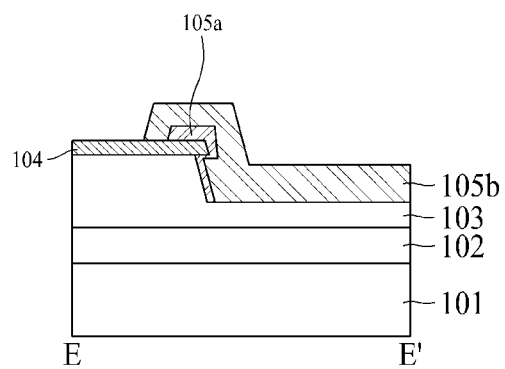

Subsequently, as illustrated in FIGS. 13A to 13C, the second material provided in an opening region and the first boundary groove 109a may be removed. In this case, the second material provided in the second boundary groove 109b may not be removed.

Therefore, a second bank 105b may be formed.

Moreover, the undercut UC described above may be formed. That is, only a portion, where the first boundary groove 109a is formed, of the initial undercut IUC may be the undercut UC. To provide an additional description, a region, which is not covered by the second bank 105b, of the initial undercut IUC may be the undercut UC, and a region uncovered by the second bank 105b may be the initial undercut IUC. In FIG. 13A, the undercut UC is illustrated by a thick line. That is, in FIG. 13A, a region illustrated by a dotted line at the outer portion of the anode 104 may be a region where the initial undercut IUC is formed, and a region illustrated by a thick line may be a region where the undercut UC is formed.

As described above, a main cathode 107a and a boundary region cathode 107b may be isolated from each other in the undercut UC. However, the main cathode 107a may be continuously formed in the initial undercut IUC.

Figure 14A:
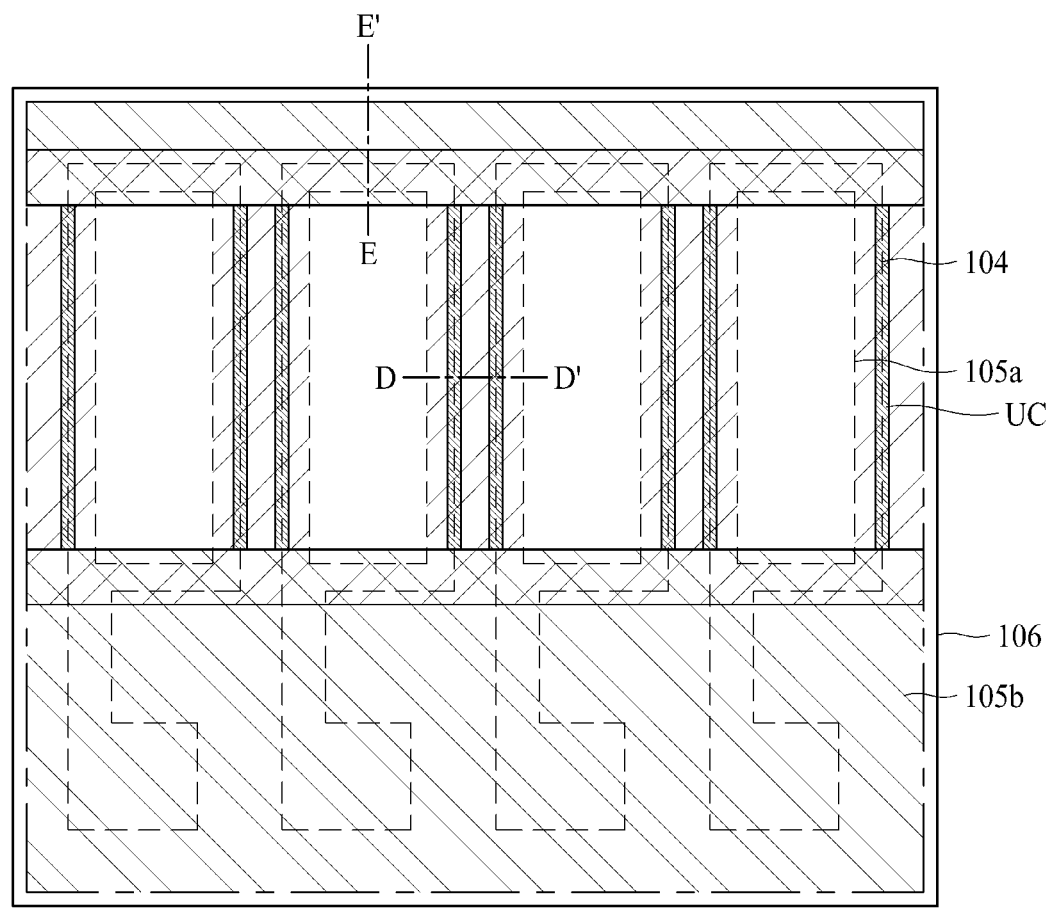
Figure 14B:
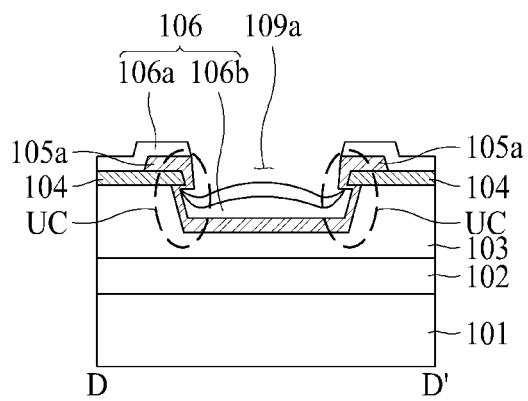
Figure 14C:
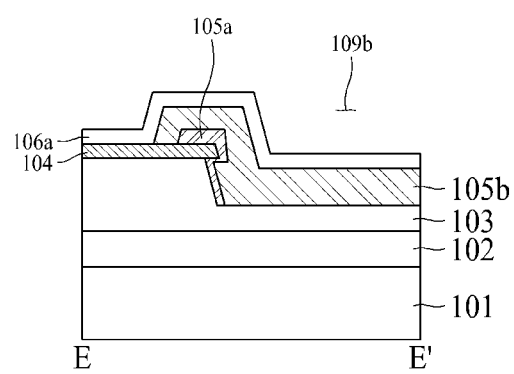

Subsequently, as illustrated in FIGS. 14A to 14C, the light emitting layer 106 may be provided all over the substrate 101. In this case, as illustrated in FIGS. 5 and 14B, the main light emitting layer 106a and the boundary region light emitting layer 106b may be isolated from each other in the first boundary groove 109a, and as illustrated in FIGS. 5 and 14C, the main light emitting layer may be continuously formed in the second boundary groove 109b.

Figure 15A:
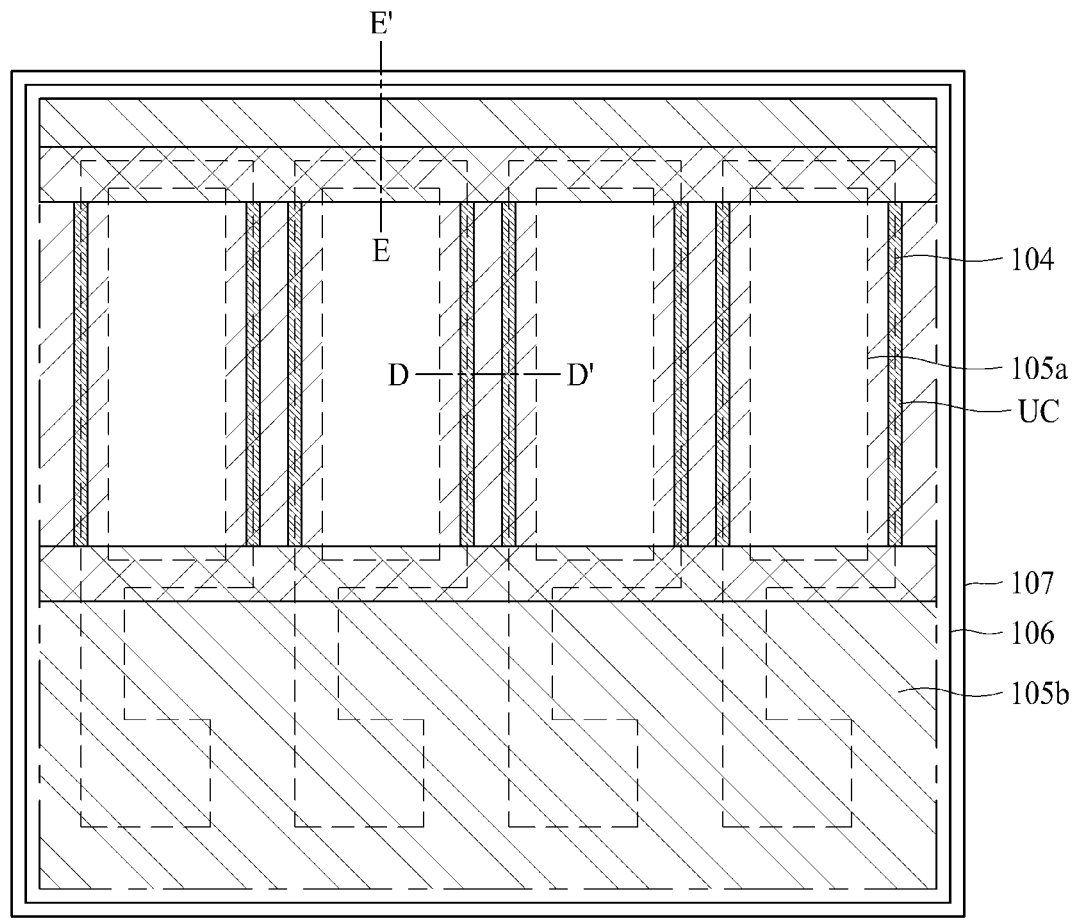
Figure 15B:
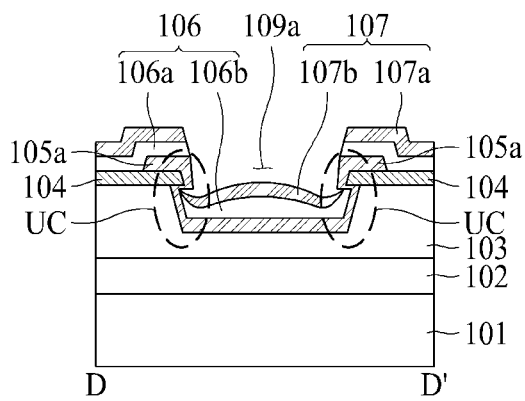
Figure 15C:
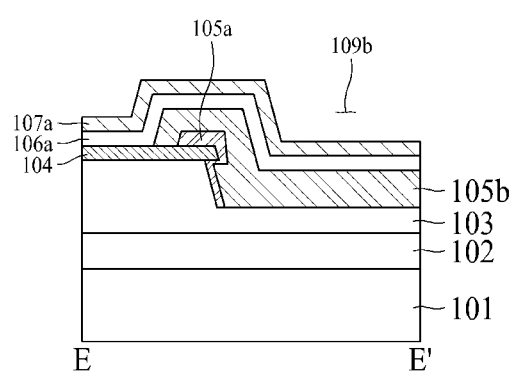

Subsequently, as illustrated in FIGS. 15A to 15C, the cathode 107 may be provided all over the substrate 101.

In this case, as illustrated in FIGS. 5 and 15B, the main cathode 107a and the boundary region cathode 107b may be isolated from each other in the first boundary groove 109a, and as illustrated in FIGS. 5 and 15C, the main cathode 107a may be continuously formed in the second boundary groove 109b.

Finally, an upper end of the cathode 107 may be covered by a passivation layer.

FIGS. 16 to 20 are plan views schematically illustrating a plurality of pixels included in a light emitting display panel according to the present disclosure.

Particularly, in FIGS. 16 to 20, for convenience of description, an undercut UC is illustrated by a thick line, and an initial undercut IUC is illustrated by a dotted line.

Moreover, in FIGS. 16 to 20, for convenience of description, only an anode 104, a first bank 105a, and a second bank 105b are illustrated.

As described above, the main cathode 107a and the boundary region cathode 107b may be isolated from each other in the undercut UC, and the main cathode 107a may be continuously formed in the initial undercut IUC. Also, the boundary region light emitting layer 106b and the main light emitting layer 106a may be isolated from each other in the undercut UC, and the main light emitting layer 106a may be continuously formed in the initial undercut IUC.

Figure 16:
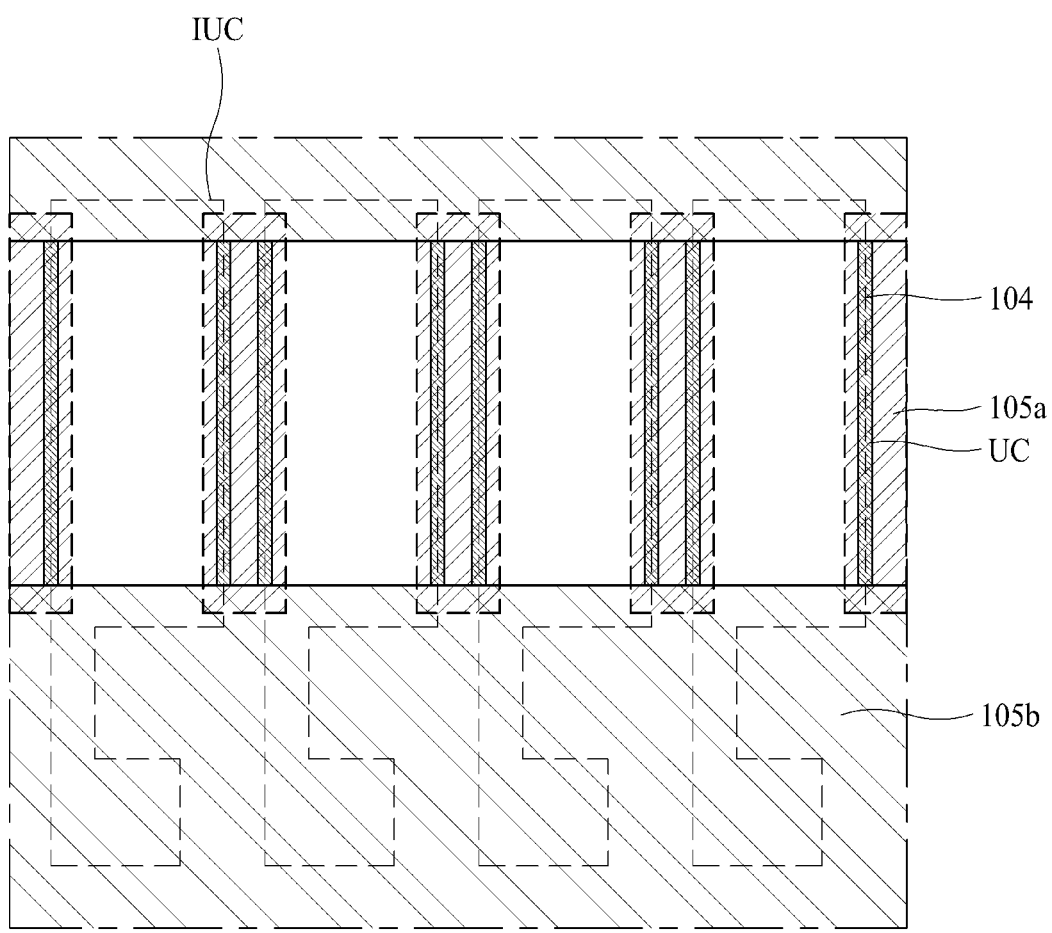
FIGS. 16 to 20 are plan views schematically illustrating a plurality of pixels included in a light emitting display panel according to the present disclosure.

First, FIG. 16 illustrates a plan view schematically illustrating the plan view illustrated in FIG. 3. That is, FIG. 16 schematically illustrates a plan view of the light emitting display apparatus described above with reference to FIGS. 3, 5, and 6.

Particularly, in the light emitting display apparatus illustrated in FIG. 16, the first bank 105a may be provided in the first boundary groove 109a between pixels arranged in a first direction (for example, a direction in which a gate line extends) of the substrate 101 among boundary grooves, and thus, undercuts UC may be provided in first boundary grooves 109a.

However, the second bank 105b may be provided in the second boundary groove 109b between pixels arranged in a second direction (for example, a direction in which a data line extends) of the substrate 101 among the boundary grooves, and thus, initial undercuts IUC may be provided in second boundary grooves 109b.

Therefore, main cathodes 107a provided in different pixels may be isolated from one another in regions where the undercuts UC are formed, and the main cathodes 107a provided in different pixels may be connected to one another through regions where the initial undercuts IUC are formed.

Figure 17:
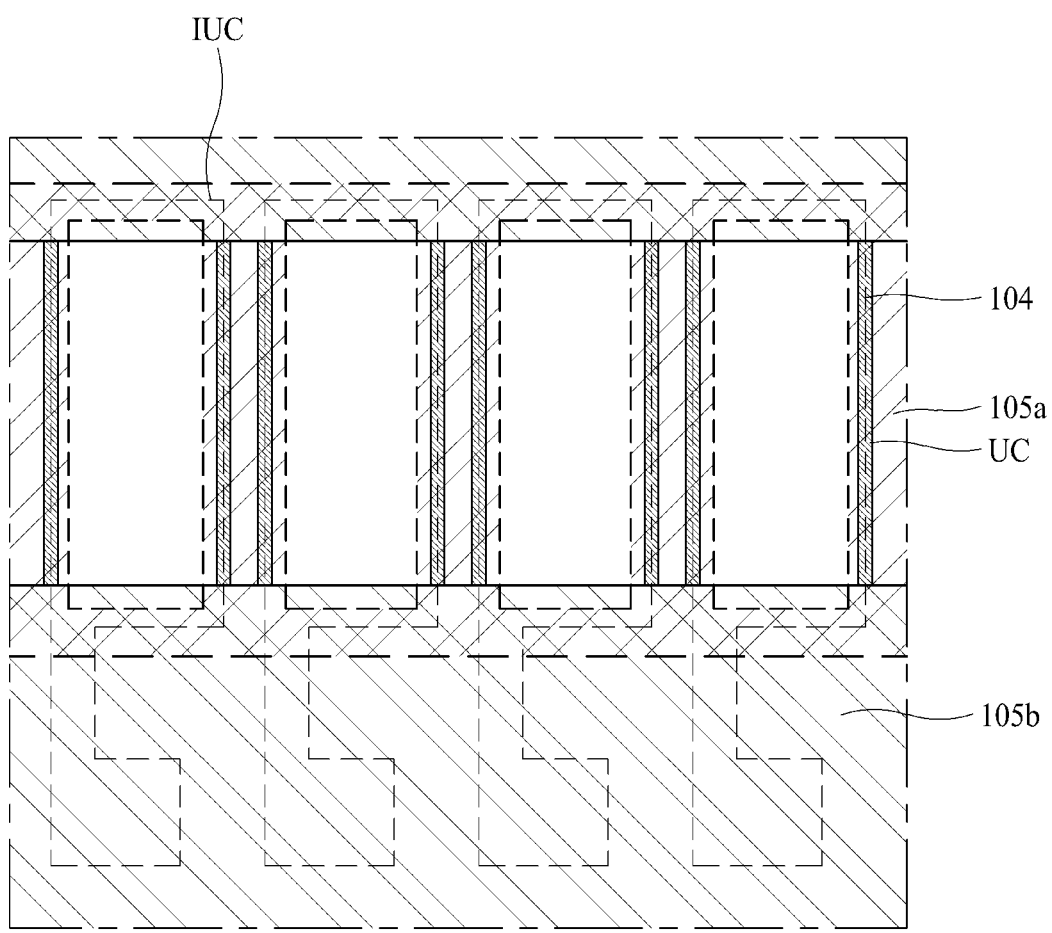

FIG. 17 illustrates a plan view schematically illustrating the plan view illustrated in FIG. 4. That is, FIG. 17 schematically illustrates a plan view of the light emitting display apparatus described above with reference to FIGS. 4, 5, and 6.

Particularly, in the light emitting display apparatus illustrated in FIG. 17, the first bank 105a may be provided in the first boundary groove 109a between pixels arranged in the first direction of the substrate 101 among the boundary grooves, and thus, undercuts UC may be provided in the first boundary grooves 109a.

However, the first bank 105a and the second bank 105b may be provided in the second boundary groove 109b between pixels arranged in a second direction of the substrate 101 among the boundary grooves, and thus, the initial undercuts IUC may be provided in the second boundary grooves 109b.

Therefore, the main cathodes 107a provided in different pixels may be isolated from one another in regions where the undercuts UC are formed, and the main cathodes 107a provided in different pixels may be connected to one another through regions where the initial undercuts IUC are formed.

Figure 18:
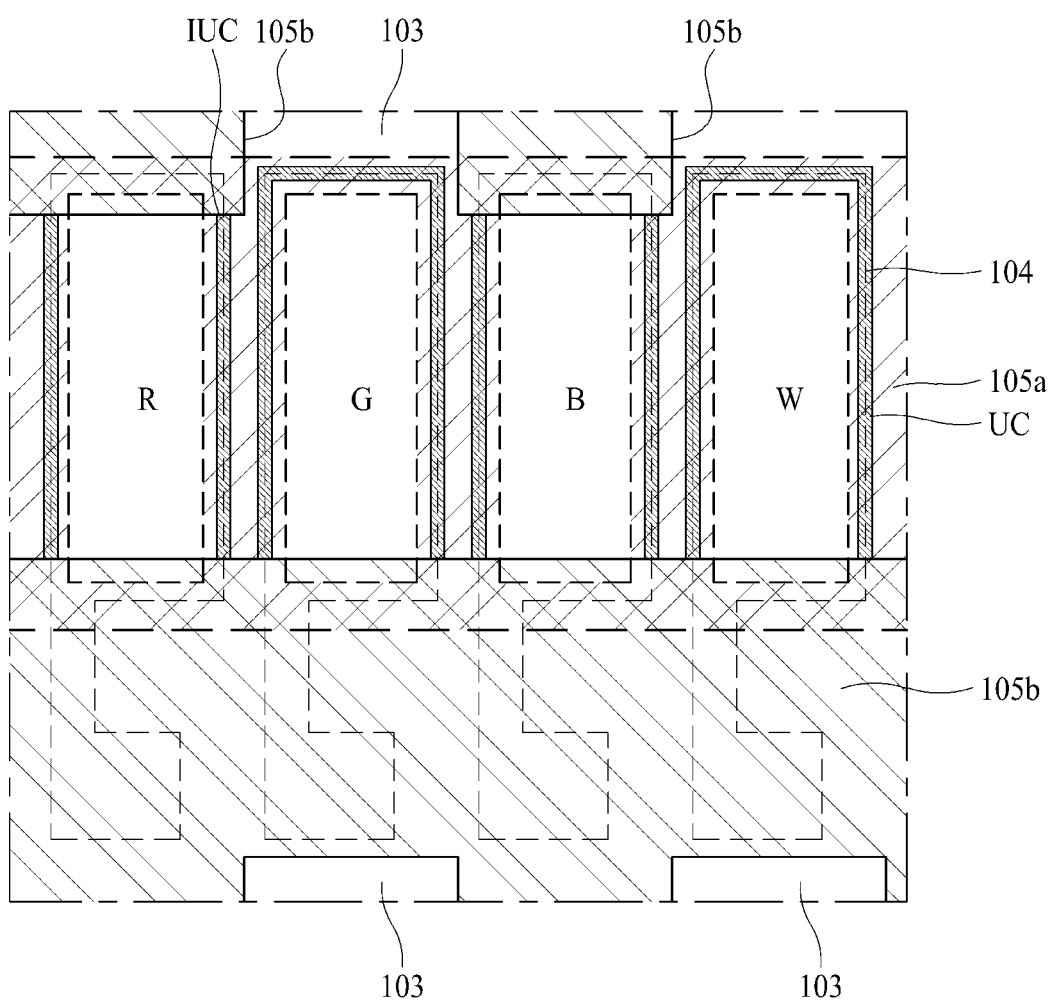
Figure 19:
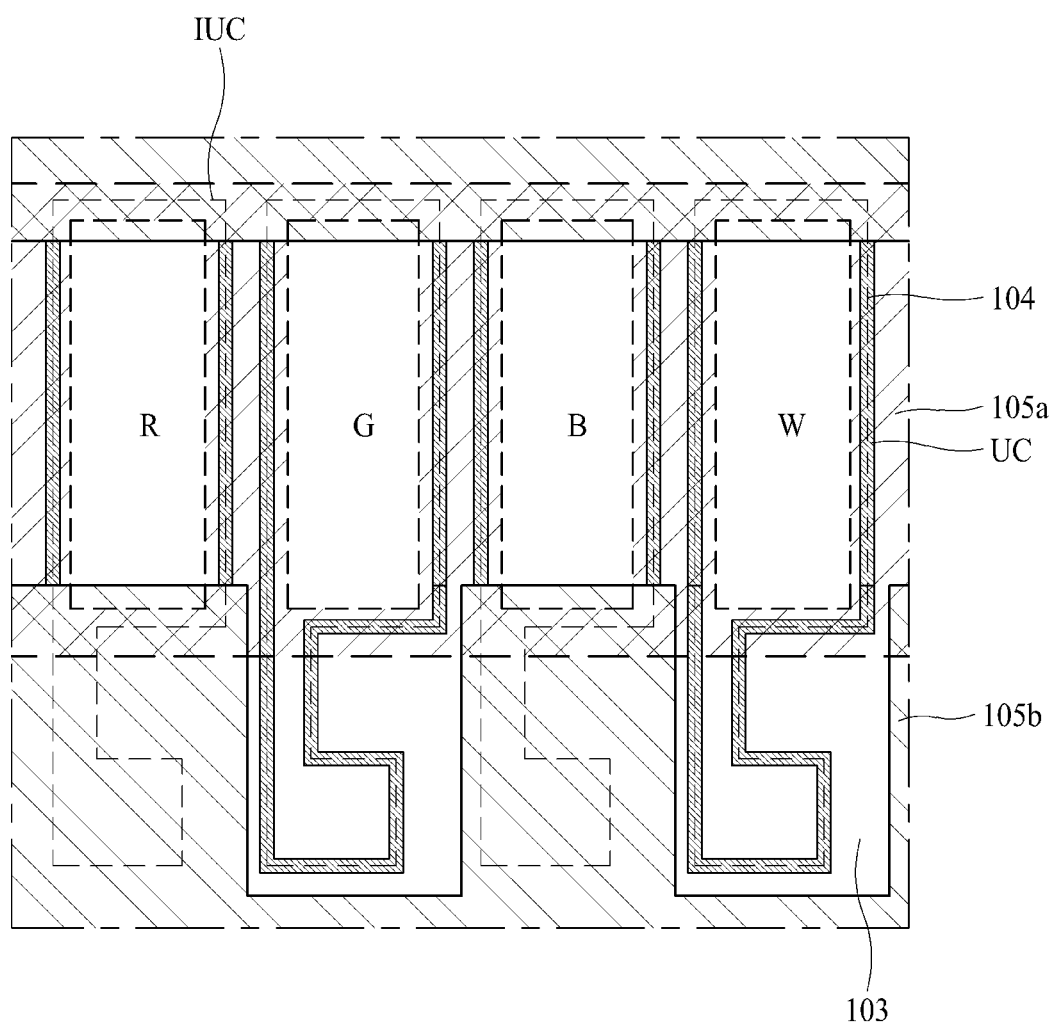

FIGS. 18 and 19 schematically illustrate plan views according to other embodiments of the present disclosure.

Particularly, in FIGS. 18 and 19, a light emitting display apparatus where the second bank 105b are provided in some second boundary grooves but not other second boundary grooves is illustrated.

For example, in a light emitting display apparatus illustrated in FIG. 18, the second bank 105b may be provided in second boundary grooves adjacent to upper ends of a red pixel R and a blue pixel B among second boundary grooves 109b, and a planarization layer 103 may be exposed at second boundary grooves adjacent to a green pixel G and a white pixel W. That is, the planarization layer may be exposed at a second boundary groove including no second bank among the second boundary grooves.

Moreover, in a light emitting display apparatus illustrated in FIG. 19, the second bank 105b may be provided in second boundary grooves adjacent to lower ends of the red pixel R and the blue pixel B among the second boundary grooves 109b, and the planarization layer 103 may be exposed at the second boundary grooves adjacent to the green pixel G and the white pixel W.

That is, in the present disclosure, the second bank 105b may be formed in all of the second boundary grooves 109b, or may be formed in some second boundary grooves 109b.

As described above, an undercut UC may be formed in a region where the second bank 105b is not provided. Therefore, in the light emitting display apparatus illustrated in FIG. 18, an undercut UC may be formed in second boundary grooves adjacent to upper ends of the green pixel G and the white pixel W among the second boundary grooves 109b. Also, in the light emitting display apparatus illustrated in FIG. 19, an undercut UC may be formed in second boundary grooves adjacent to lower ends of the green pixel G and the white pixel W among the second boundary grooves 109b.

In this case, main cathodes 107a provided in different pixels may be isolated from one another in regions where undercuts UC are formed, and the main cathodes 107a provided in different pixels may be connected to one another through regions where initial undercuts IUC are formed.

Figure 20:
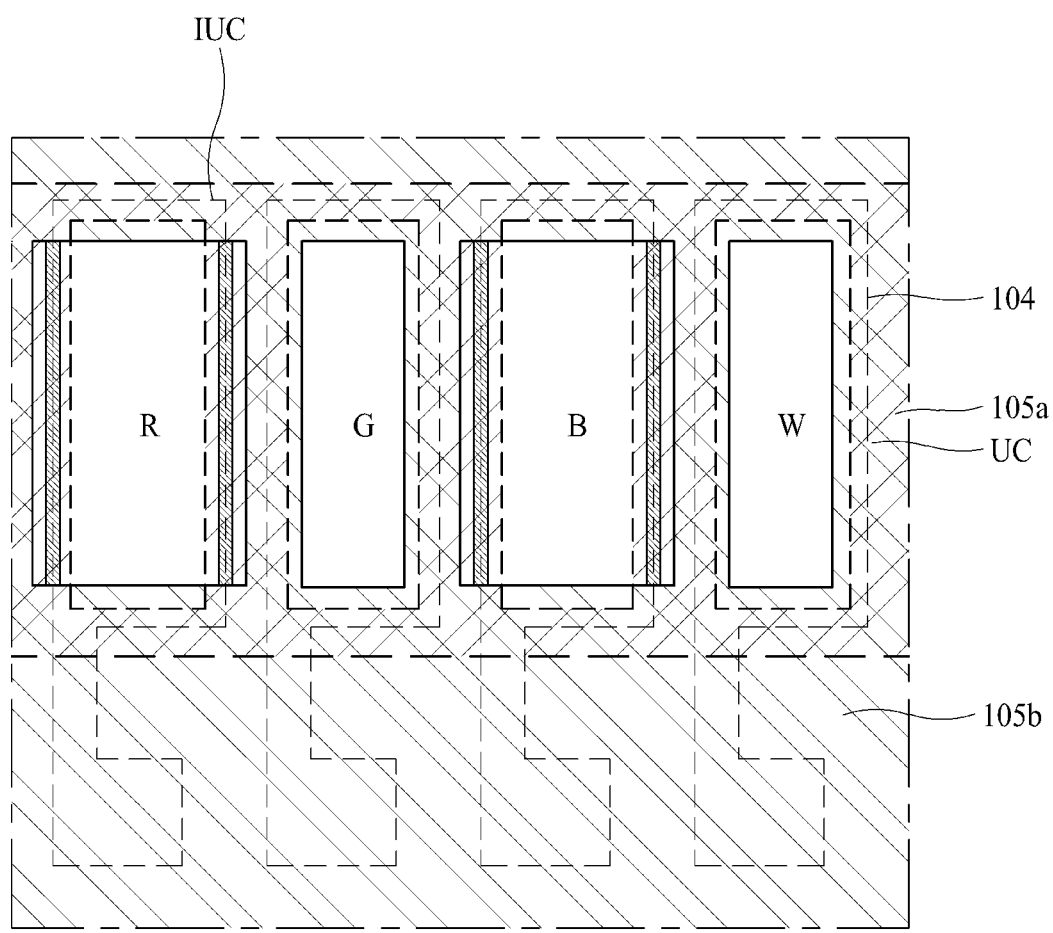

Finally, FIG. 20 schematically illustrates a plan view according to another embodiment of the present disclosure.

Particularly, in FIG. 20, a light emitting display apparatus where the second bank 105b are provided in second boundary grooves 109b and some first boundary grooves 109a is illustrated. That is, the second bank may be provided in at least one of first boundary grooves 109a provided between pixels arranged in a first direction.

For example, in a light emitting display apparatus illustrated in FIG. 20, the second bank 105b may be provided in all second boundary grooves 109b, and the second bank 105b may surround an outer portion of a green pixel G and an outer portion of a white pixel W.

That is, the second bank 105b may be provided in first boundary grooves 109a adjacent to the green pixel G and the white pixel W among the first boundary grooves 109a.

Therefore, in the light emitting display apparatus illustrated in FIG. 20, because the second bank 105b is provided in the first boundary grooves 109a adjacent to the green pixel G and the white pixel W among the first boundary grooves 109a, an undercut UC may not be formed in the first boundary grooves 109a adjacent to the green pixel G and the white pixel W.

That is, according to the present disclosure, a position of the undercut UC may be variously changed by various combinations of the first bank 105a and the second bank 105b.

Accordingly, a position of the undercut UC may be variously changed based on a position or a pattern where a lateral leakage current (LLC) between pixels occurs, and thus, an LLC between pixels may be prevented.

According to the present disclosure, ends of a first bank (an inorganic bank) surrounding an anode may be protected by a second bank (an organic bank), and thus, the shrinkage of an emission area may be prevented. That is, in the present disclosure, because an end portion of an undercut is covered by the first bank having a thin thickness and the second bank which is thicker than the first bank, a passivation layer covering a cathode may fully cover the cathode at an end portion of the undercut. Therefore, a defect where the cathode is exposed by the passivation layer may be reduced, and thus, the pollution of the cathode may be prevented, thereby preventing an emission area of the light emitting device from being reduced.

According to the present disclosure, a groove having a uniform depth may be formed at an outer portion of the anode. Accordingly, in forming a bank or various layers (for example, PDL) through a CVD process, certain step coverage may be secured. Also, because an arrival angle of a CVD precursor is constant, a layer having a constant thickness and uniformity may be formed.

According to the present disclosure, banks including various materials may be provided at the outer portion of the anode. Particularly, electrodes may be sufficiently isolated from one another with the second band (the organic bank) which is formed to be thick, and thus, a parasitic capacitance may be reduced in all of a light emitting display panel, thereby enhancing a production yield rate of a light emitting display panel.

Moreover, various electrodes (for example, electrodes configuring a pixel driving circuit) provided under the second bank may be safely protected by the second band (the organic bank) which is formed to be thick.

According to the present disclosure, the emission of light caused by an LLC between adjacent pixels may be prevented, and thus, a color reproduction rate of a light emitting display apparatus may increase.

According to the present disclosure, because a black bank including an organic material may be applied, a front reflectance of a light emitting display panel may be reduced, and a success rate of laser repair may be enhanced. Accordingly, a production yield rate of a light emitting display panel may be enhanced.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus comprising:
a planarization layer on a substrate;
a plurality of anodes on the planarization layer;
a bank including a plurality of opening regions exposing the plurality of anodes;
a light emitting layer on the plurality of anodes and the bank; and
a cathode on the light emitting layer, the cathode including a boundary region cathode and a main cathode,
wherein a boundary groove is located at an outer portion of each of the plurality of anodes, the boundary groove including a first boundary groove located between pixels arranged in a first direction of the substrate, and a second boundary groove located between pixels arranged in a second direction that is different from the first direction,
wherein the bank comprises:
a first bank including a first material that covers the first boundary groove in the planarization layer; and
a second bank including a second material that is different from the first material of the first bank, the second bank covering the second boundary groove in the planarization layer,
wherein the first boundary groove includes an undercut, the boundary region cathode isolated from the main cathode in the first boundary groove by the undercut.

2. The light emitting display apparatus of claim 1, wherein the boundary region cathode is in the first boundary groove, and the main cathode is in the plurality of opening regions and the second boundary groove.

3. The light emitting display apparatus of claim 1, wherein the boundary region cathode is located between pixels arranged in the first direction that is parallel to a gate line that is on the substrate.

4. The light emitting display apparatus of claim 1, wherein the light emitting layer comprises:
a boundary region light emitting layer in the first boundary groove; and
a main light emitting layer in the plurality of opening regions and the second boundary groove, and
wherein the boundary region light emitting layer and the main light emitting layer are isolated from each other in the first boundary groove by the undercut.

5. The light emitting display apparatus of claim 4, wherein the undercut is in the first boundary groove that is located between a pair of anodes that are adjacent to each other in the first direction.

6. The light emitting display apparatus of claim 4, wherein the boundary region light emitting layer and the main emitting layer are connected to each other in a region between pixels adjacent to each other in the second direction.

7. The light emitting display apparatus of claim 1, wherein a height of the planarization layer in the first boundary groove and a height of the planarization layer in the second boundary groove is less than a height of the planarization layer in a region outside of the first boundary groove and the second boundary groove.

8. The light emitting display apparatus of claim 4, wherein the first bank is on the planarization layer in the first boundary groove, the boundary region light emitting layer is on the first bank in the first boundary groove, and the boundary region cathode is on the boundary region light emitting layer in the first boundary groove.

9. The light emitting display apparatus of claim 8, wherein an end of an anode from the plurality of anodes protrudes toward the first boundary groove past a lateral surface of the planarization layer, and the undercut is between the planarization layer and the end of the anode protruding toward the first boundary groove.

10. The light emitting display apparatus of claim 4, wherein the second bank is on the planarization layer in the second boundary groove, the main light emitting layer is on the second bank in the second boundary groove, and the main cathode is on the main light emitting layer in the second boundary groove.

11. The light emitting display apparatus of claim 4, wherein the first bank is on the planarization layer in the second boundary groove such that the first bank is between the second boundary groove and the planarization layer in the second boundary groove, the main light emitting layer is on the second bank in the second boundary groove, and the main cathode is on the main light emitting layer in the second boundary groove.

12. The light emitting display apparatus of claim 11, wherein the first bank in the second boundary groove covers a portion of an anode from the plurality of anodes that extends toward the second boundary groove past a lateral surface of the second boundary groove.

13. The light emitting display apparatus of claim 1, wherein the first material of first bank comprises an inorganic material and the second material of the second bank comprises an organic material.

14. The light emitting display apparatus of claim 1, wherein the second boundary groove is from a plurality of second boundary grooves that are between pixels arranged in the second direction, and the second bank is not in at least one of the plurality of second boundary grooves.

15. The light emitting display apparatus of claim 14, wherein the planarization layer is exposed at the at least one of the plurality of second boundary grooves that lacks the second bank.

16. The light emitting display apparatus of claim 14, wherein the at least one of the plurality of second boundary grooves that lacks the second bank includes an undercut that isolates the boundary region cathode from the main cathode in the at least one of the plurality of second boundary grooves.

17. The light emitting display apparatus of claim 1, wherein the first boundary groove is from a plurality of first boundary grooves that are between pixels arranged in the first direction, and the second bank is in at least one of first boundary grooves.

18. The light emitting display apparatus of claim 17, wherein one of the first boundary grooves from the plurality of first boundary grooves that lacks the second bank also lacks an undercut that isolates the boundary region cathode from the main cathode, and
the at least one of first boundary grooves that includes the second bank includes an undercut that isolates the boundary region cathode from the main cathode in the at least one of the first boundary grooves.

19. A light emitting display apparatus comprising:
a substrate;
a planarization layer on the substrate;
a plurality of pixels on the planarization layer including a first pixel, a second pixel, and a third pixel, the first pixel and the second pixel adjacent to each other in a first direction, and the first pixel and the third pixel adjacent to each other in a second direction that is different from the first direction;

a first boundary groove in the planarization layer, the first boundary groove between the first pixel and the second pixel;

a second boundary groove in the planarization layer, the second boundary groove between the first pixel and the third pixel; and a plurality of banks that define light emission regions of the plurality of pixels, the plurality of banks including a first bank that is in the first boundary groove and a second bank that is in the second boundary groove, wherein a thickness of the first bank in the first boundary groove is less than a thickness of the second bank in the second boundary groove, and a third direction, which is a thickness direction, is a direction perpendicular to the first direction and the second direction.

20. The light emitting display apparatus of claim 19, wherein the first pixel includes a first anode, a first light emitting layer on the first anode, and a first cathode on the first light emitting layer in a first light emission region of the first pixel, wherein the second pixel includes a second anode, a second light emitting layer on the second anode, and a second cathode on the first light emitting layer in a second light emission region of the second pixel, and wherein a third light emitting layer is on the first bank in the first boundary groove and a third cathode is on the third light emitting layer in the first boundary groove, the third light emitting layer isolated from the first light emitting layer and the second light emitting layer in the first boundary groove, and the third cathode isolated from the first cathode and the second cathode in the first boundary groove.

21. The light emitting display apparatus of claim 20, wherein a first undercut is in the first boundary groove between the planarization layer and a portion of the first anode that extends past a first lateral surface of the planarization layer, and a second undercut is in the first boundary groove between the planarization layer and a portion of the second anode that extends past a second lateral surface of the planarization layer, wherein the first undercut isolates the third light emitting layer in the first boundary groove from the first light emitting layer and isolates the third cathode in the first boundary groove from the first cathode, and wherein the second undercut isolates the third light emitting layer in the first boundary groove from the second light emitting layer and isolates the third cathode in the first boundary groove from the second cathode.

22. The light emitting display apparatus of claim 20, wherein the first light emitting layer of the first pixel extends from the first light emission region onto the second bank in the second boundary groove, and the first cathode extends from the first light emission region onto the first light emitting layer in the second boundary groove.

23. The light emitting display apparatus of claim 19, wherein the first bank comprises a first material and the second bank comprises a second material that is different from the first material.

24. The light emitting display apparatus of claim 23, wherein the first material includes an inorganic material and the second material includes an organic material.

* * * * *